(12) United States Patent
Sato et al.

(10) Patent No.: US 7,471,491 B2
(45) Date of Patent: Dec. 30, 2008

(54) MAGNETIC SENSOR HAVING A FREQUENCY FILTER COUPLED TO AN OUTPUT OF A MAGNETORESISTANCE ELEMENT

(75) Inventors: Rie Sato, Yokohama (JP); Koichi Mizushima, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 359 days.

(21) Appl. No.: 11/087,621

(22) Filed: Mar. 24, 2005

(65) Prior Publication Data

US 2005/0219771 A1 Oct. 6, 2005

(30) Foreign Application Priority Data

Mar. 30, 2004 (JP) ............................ 2004-099385
Jun. 25, 2004 (JP) ............................ 2004-187124

(51) Int. Cl.
*G11B 5/39* (2006.01)
(52) U.S. Cl. ..................... 360/313; 360/65; 360/66; 360/67; 360/324.1
(58) Field of Classification Search ......... 360/313–328, 360/65–67
See application file for complete search history.

(56) References Cited

U.S. PATENT DOCUMENTS

| | | | | |
|---|---|---|---|---|
| 5,949,600 A * | 9/1999 | Akiyama et al. | ............... | 360/55 |
| 6,351,409 B1 * | 2/2002 | Rizzo et al. | ............... | 365/158 |
| 6,452,240 B1 * | 9/2002 | Ingvarsson et al. | .......... | 257/421 |
| 6,501,971 B1 * | 12/2002 | Wolf et al. | ................... | 505/210 |
| 6,738,208 B2 * | 5/2004 | Dakroub | ....................... | 360/31 |
| 2005/0212625 A1 * | 9/2005 | Celinski et al. | ............. | 333/204 |

OTHER PUBLICATIONS

N. Stutzke, et al., "Temperature and field dependence of high-frequency magnetic noise in spin valve devices", Applied Physics Letter, American Institute of Physics, vol. 82, No. 1, Jan. 6, 2003, pp. 91-93.

Tim Rausch, et al., "Experimental Effects of Laser Power on the Writability and Pulse Width in a Heat Assisted Longitudinal Recording System", JPN. J. Appl. Phys., The Japan Society of Applied Physics, vol. 42, Part 1, No. 2B, Feb. 2003, pp. 989-994.

* cited by examiner

*Primary Examiner*—A. J. Heinz
(74) *Attorney, Agent, or Firm*—Oblon, Spivak, McClelland, Maier & Neustadt, P.C.

(57) ABSTRACT

A magnetic sensor includes a magnetoresistance element having a peak of a thermal fluctuation strength of magnetization under a magnetic field having a certain frequency, a frequency filter connected to the magnetoresistance element and having its transmittance decreased or increased in substantially the frequency of the magnetic field to output a signal corresponding substantially to the peak of the thermal fluctuation strength of magnetization, and a detector connected to the frequency filter to detect the magnetic field based on the signal of the frequency filter.

10 Claims, 13 Drawing Sheets

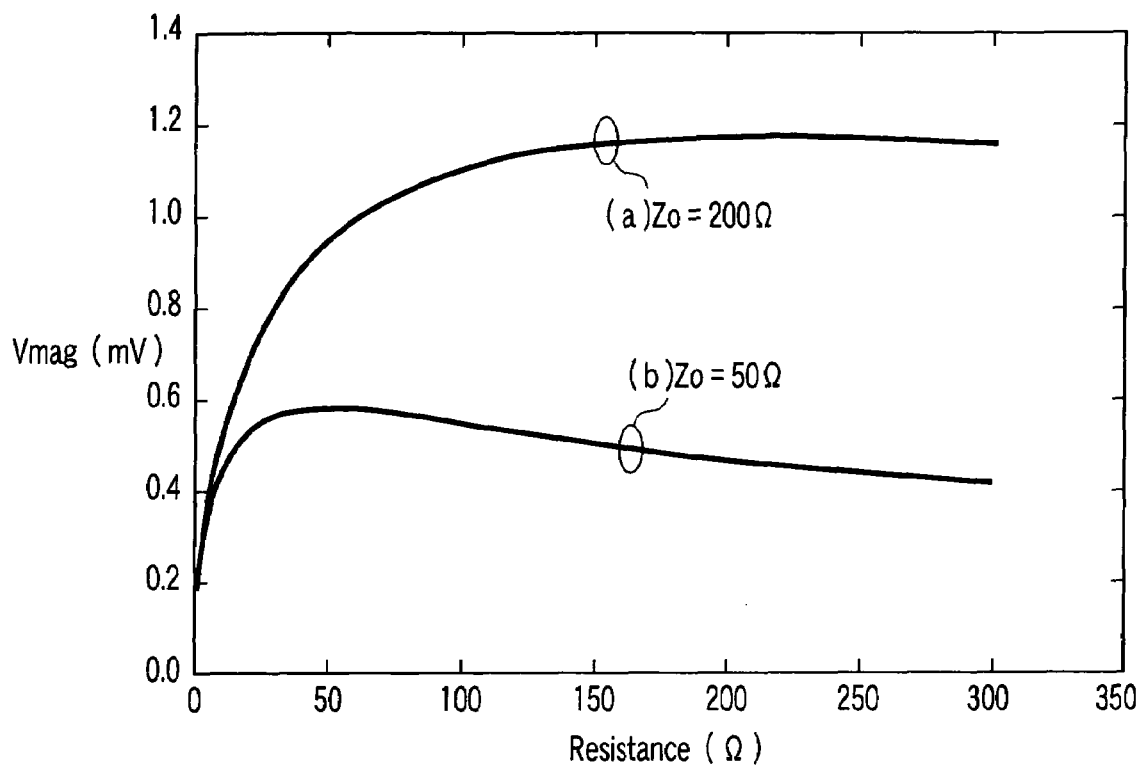
F I G. 3
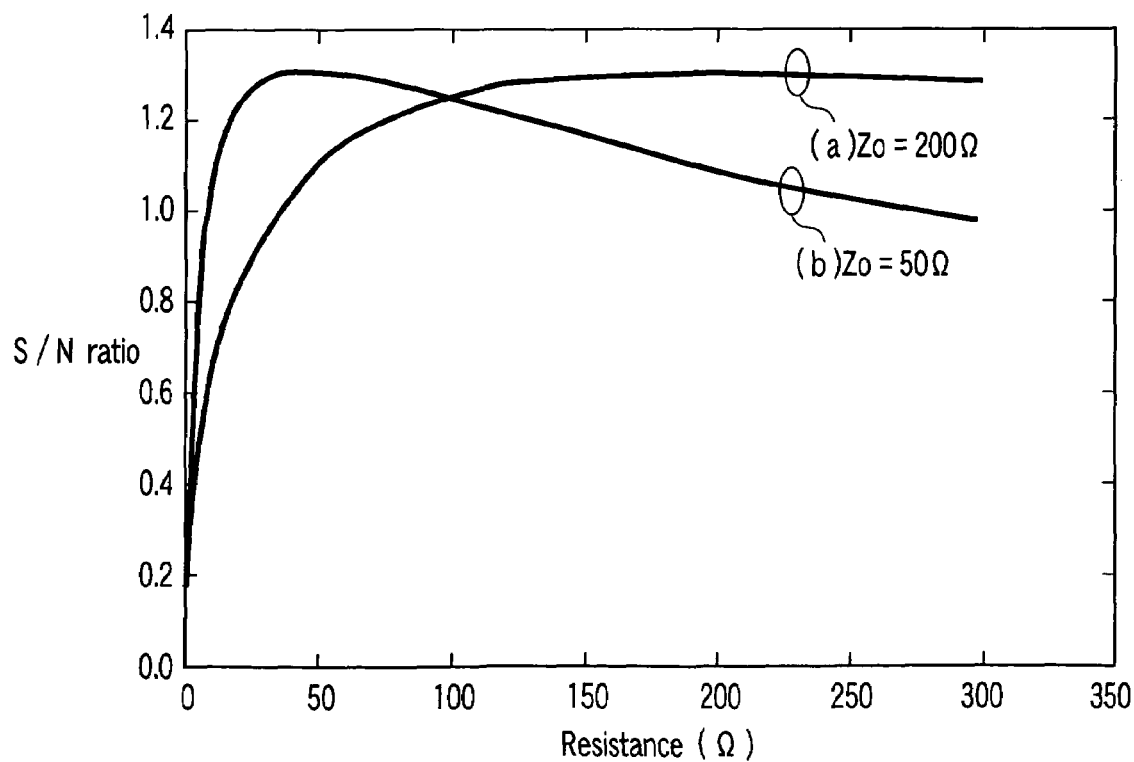
F I G. 4

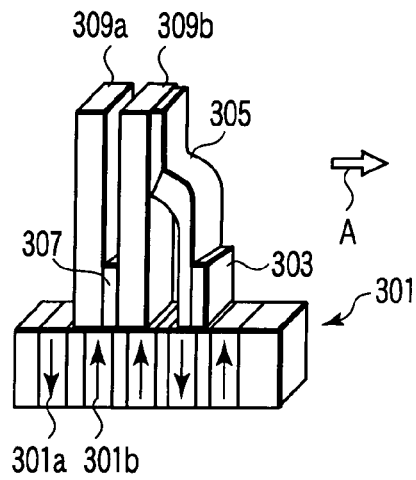
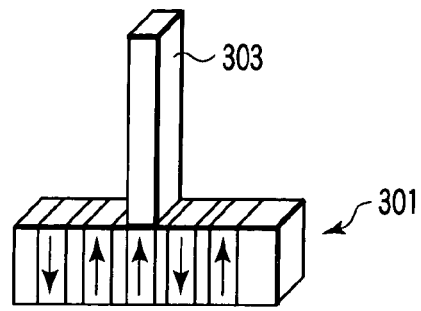
F I G. 19A    F I G. 19B
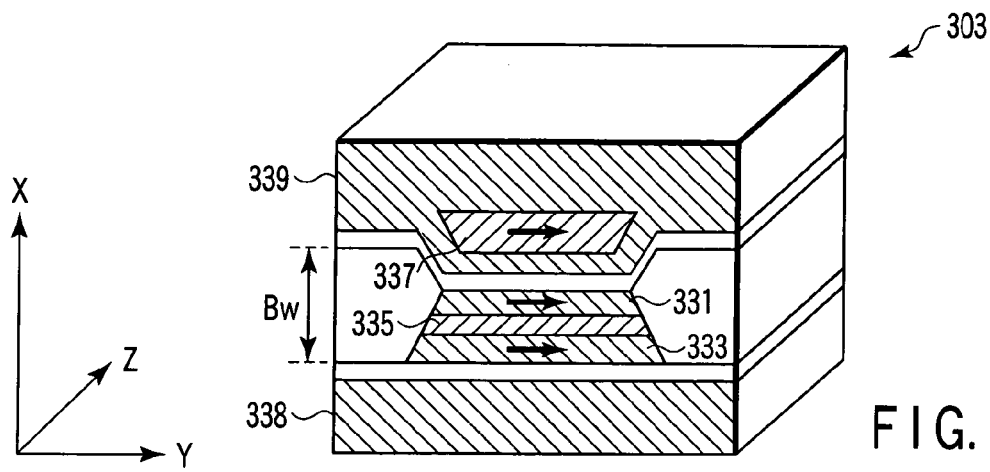
F I G. 20
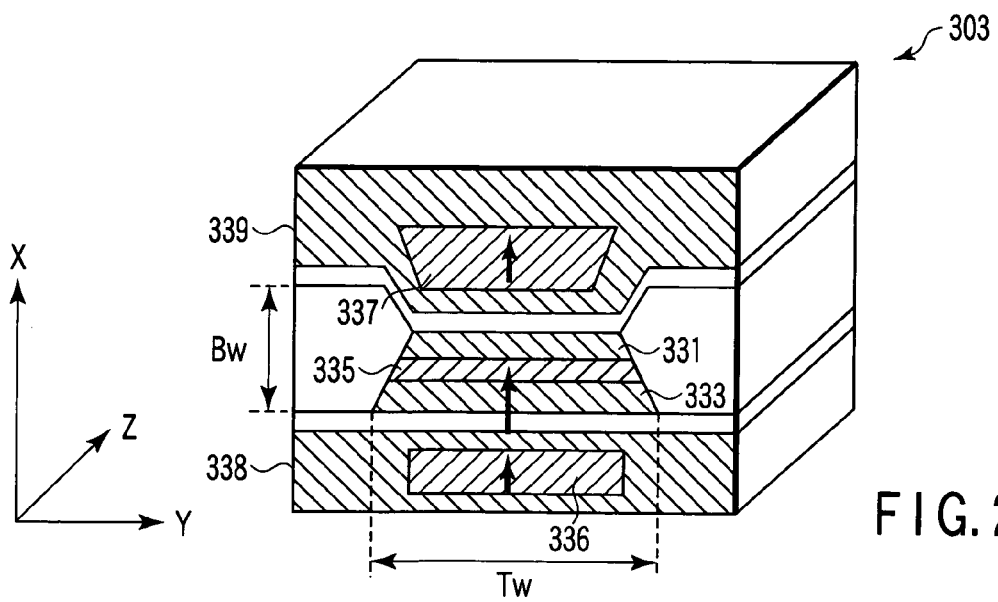
F I G. 21

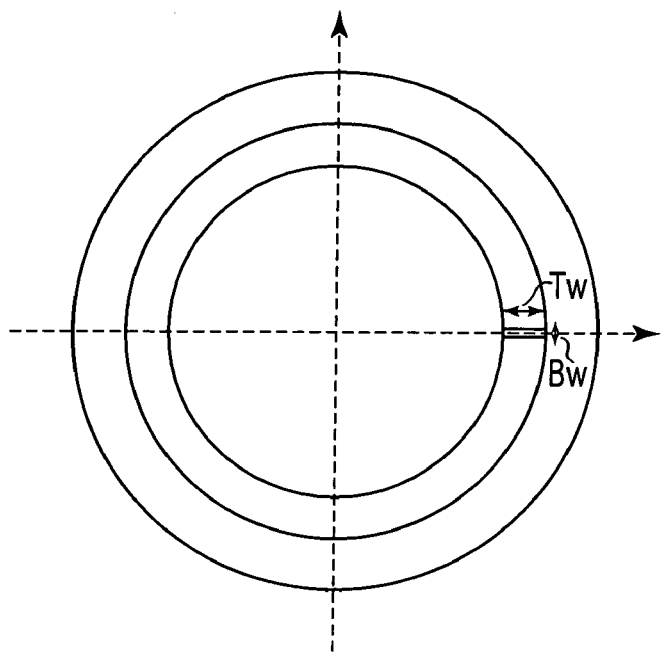
FIG. 22A
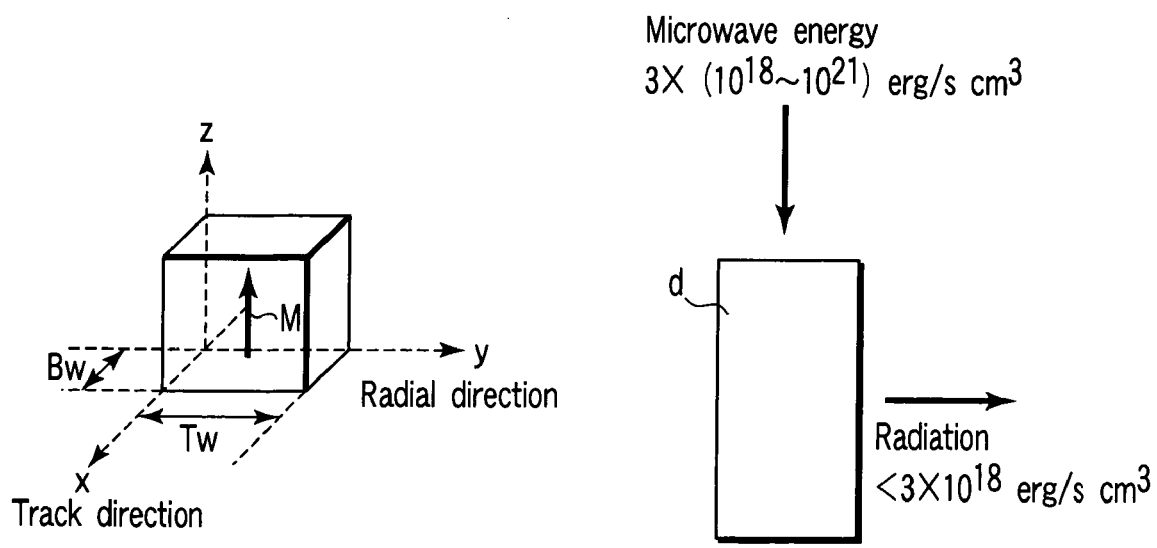
FIG. 22B
FIG. 23

MAGNETIC SENSOR HAVING A FREQUENCY FILTER COUPLED TO AN OUTPUT OF A MAGNETORESISTANCE ELEMENT

CROSS-REFERENCE TO RELATED APPLICATIONS

This application is based upon and claims the benefit of priority from prior Japanese Patent Applications No. 2004-099385, filed Mar. 30, 2004; and No. 2004-187124, filed Jun. 25, 2004, the entire contents of both of which are incurporated herein by reference.

BACKGROUND OF THE INVENTION

1. Field of the Invention

The present invention relates to a magnetic sensor, a magnetic field sensing method, a magnetic recording head, and a magnetic memory device such as a magnetic random access memory.

2. Description of the Related Art

Since the advent of a GMR head utilizing the giant magnetoresistive effect (GMR effect) as a magnetic read head, the recording density of magnetic recording has increased at an annual rate of about 100%. The GMR head includes a composite film, i.e., a magnetic multilayer, of a sandwich structure of ferromagnetic layer/nonmagnetic layer/ferromagnetic layer. With the GMR head, one ferromagnetic layer is subjected to an exchange bias to pin its magnetization, and the other ferromagnetic layer is subjected to an external magnetic field to change the direction of its magnetization. A change in the relative angle between the magnetization directions of the two ferromagnetic layers is detected as a change in resistance. So far, a CIP (Current-In-Plane)-GMR element and a CPP (Current-Perpendicular-to-Plane)-GMR element have been developed. With the CIP-GMR element, a current is caused to flow in the magnetic multilayer plane to detect a change in resistance. With the CPP-GMR element, a current is caused to flow perpendicularly to the magnetic multilayer plane to detect a change in resistance. These GMR elements exhibit a magnetoresistance effect of about 10% and are expected to allow for a recording density of up to about 200 Gbit/inch$^2$ (Gbpsi).

To allow for magnetic recording at higher recording densities, a TMR element has been under development which utilizes the tunneling magnetoresistance (TMR) effect. The TMR element includes a composite film of ferromagnetic layer/insulator layer/ferromagnetic layer. A voltage is applied between the ferromagnetic layers to cause a tunnel current to flow. The TMR element utilizes the fact that the magnitude of the tunnel current changes with the magnetization directions of the upper and lower ferromagnetic layers and detects a change in the relative angle between the magnetization directions of the ferromagnetic layers as a change in tunnel resistance. The TMR element, being larger in MR ratio than the GMR element (about 50% at maximum) and high in signal voltage, is expected to allow for a recording density of about 300 Gbpsi.

With magnetic recording at more than some hundreds of Gbpsi, the bit size ranges from tens of nm to 100 nm. To avoid thermal fluctuation of magnetization, therefore, it is required to use a magnetic material which is large in coercivity for the magnetic recording layer. It has been proposed to perform thermally assisted recording on such a medium. With thermally assisted recording, the medium is heated to lower its coercivity and then subjected to a recording magnetic field. More specifically, to realize high-speed and localized recording, laser-based thermally assisted recording has been proposed which irradiates a medium with a laser beam having a large power density to heat it (T. Rausch, Jpn. J. Appln. Phys., 42 (2003) pp. 989-994). With this laser-based thermally assisted recording, however, it is difficult to control successfully heating of the medium and application of a magnetic field to the medium.

In addition, the TMR element has a problem that a shot noise component in an output signal is large and hence the S/N ratio (signal-to-noise ratio) cannot be improved. The shot noise is attributed to current fluctuation produced by electrons passing through the tunnel barrier irregularly. In order to suppress the shot noise and obtain a desired signal voltage, it is required to reduce the thickness of the tunnel insulating layer and thereby lower the tunnel resistance. When the thickness of the tunnel insulating layer is reduced, however, short-circuiting of the upper and lower ferromagnetic layers is liable to occur, lowering the magnetoresistance ratio (MR ratio). For this reason, it is difficult to fabricate a TMR element which exhibits good characteristics even at high recording densities.

Furthermore, with a magnetic random access memory (MRAM) in which the recorded magnetization of the ferromagnetic layers of each TMR element is used as recorded data, it is pointed out that, when its packing density is increased, the current magnetic field for writing increases.

In recent years, magnetic white noise has become a problem in common with the GMR and TMR elements. Unlike electrical noise such as the aforementioned shot noise, the white noise is caused by thermal fluctuation of micro-magnetization. For this reason, the white noise becomes more dominant as the elements become smaller in size. With elements adapted for 200-300 Gbpsi, therefore, it is supposed that the magnetic white noise will be greater in influence than the electrical noise. For example, a study is known by which high-frequency noise of a magnetic multilayer element is measured as a function of applied magnetic field and the magnetic resonance frequency of the ferromagnetic layer is examined (N. Stutzke et al., Applied Physics Letters, vol. 82, No. 1, (Jan. 6, 2003) pp. 91-93).

BRIEF SUMMARY OF THE INVENTION

An aspect of the present invention provides a magnetic sensor to sensing a magnetic field, comprising: a magnetoresistance element having a peak of a thermal fluctuation strength of magnetization under the magnetic field having a certain frequency; a frequency filter connected to the magnetoresistance element and having its transmittance decreased or increased in substantially the frequency of the magnetic field to output a signal corresponding substantially to the peak of the thermal fluctuation strength of magnetization; and a detector connected to the frequency filter to detect the magnetic field based on the signal of the frequency filter.

Another aspect of the present invention provides a magnetic recording head comprising: a recording magnetic pole; and a spin wave oscillator having a magnetization free layer, a nonmagnetic layer stacked on the magnetization free layer, a magnetization pinned layer stacked on the nonmagnetic layer, and a pair of electrodes adapted to apply a current in a direction perpendicular to a surface of the magnetization free layer, the nonmagnetic layer and the magnetization pinned layer to generate a spin wave.

BRIEF DESCRIPTION OF THE SEVERAL VIEWS OF THE DRAWING

FIG. 3 shows microwave voltage versus element resistance for the magnetoresistance element connected to a waveguide in the first embodiment;

FIG. 4 shows S/N ratio versus element resistance for the magnetoresistance element connected to a waveguide in the first embodiment;

FIG. 19A is a perspective view illustrating a magnetic head and a recording track in accordance with a fourth embodiment of the present invention;

FIG. 19B is a perspective view illustrating a spin wave oscillator and a recording track;

FIG. 20 is a perspective view of an in-plane magnetization spin wave oscillator according to the fourth embodiment;

FIG. 21 is a perspective view of a magnetization-perpendicular-to-plane spin wave oscillator according to the fourth embodiment;

FIG. 22A is a plan view illustrating recorded bits on a medium;

FIG. 22B is a perspective view illustrating the direction of magnetization;

FIG. 23 is a diagram illustrating the relationship between power supplied from the spin wave oscillator to a microportion of a medium and the radiation rate;

DETAILED DESCRIPTION OF THE INVENTION

There will now be described embodiments of the present invention in conjunction with drawings.

First Embodiment

Figure 1:
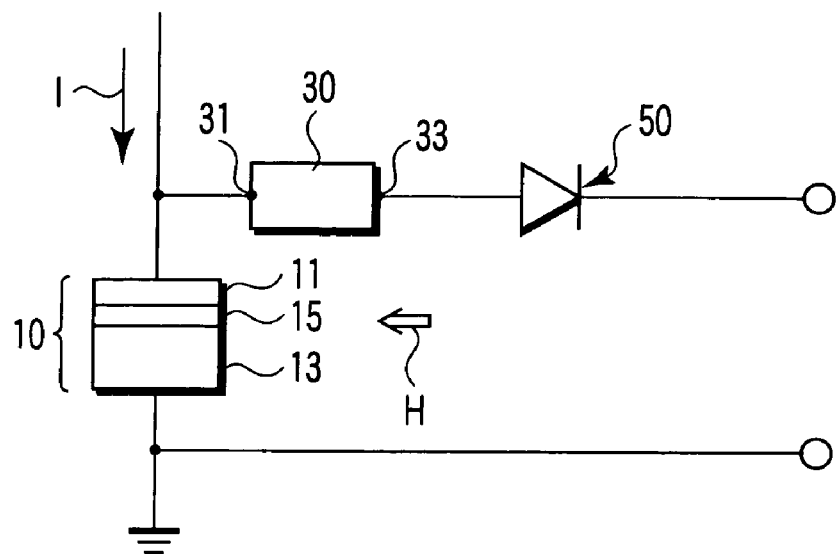
FIG. 1 shows a circuit diagram of a magnetic sensor according to a first embodiment of the present invention.

FIG. 1 shows a circuit diagram of a magnetic sensor according to the first embodiment of the present invention.

A magnetoresistance element 10 includes a pair of magnetic conductive layers 11 and 13. The magnetic conductive layer 11 is grounded, while the magnetic conductive layer 13 is connected to the input terminal 31 of a microwave filter 30. The output terminal 33 of the microwave filter 30 is connected to a detector 50. An output signal of the magnetoresistance element 10 can be read out through the microwave filter 30 and the detector 50.

The magnetoresistance element 10 is a magnetic tunnel junction element utilizing the tunnel magnetoresistance (TMR) effect or a GMR element such as a CPP-GMR element. The CPP-GMR element is a composite film of the paired magnetic conductive layers 11 and 13 and a nonmagnetic conductive layer 15 sandwiched between the magnetic conductive layers 11 and 13. The composite film is formed onto a substrate with a suitable buffer layer interposed between the composite film and the substrate. One of the paired magnetic conductive layers 11 and 13 is a magnetization pinned layer in which magnetization is pinned in one direction, and the other is a magnetization free layer in which, when it is subjected to an external magnetic field, magnetization is allowed to rotate.

The paired magnetic conductive layers 11 and 13 may both be formed into magnetization free layers in which, when they are subjected to an external magnetic field, magnetization rotates. In this case, it is desirable to set the directions of magnetization of the magnetic conductive layers 11 and 13 when the external magnetic field is zero to be antiparallel to each other.

The microwave filter 30 is either a bandstop filter or a bandpass filter, each of which utilizes the magnetic resonance phenomenon of a magnetic substance. In the bandpass filter utilizing the magnetic resonance phenomenon of a magnetic substance, the microwave transmittance increases at the frequency at which the real part $\mu'$ of the high-frequency permeability becomes zero (JAP 83, 3744 (1998)).

The detector 50 is a Schottky diode, a point-contact diode, or the like. The magnetoresistance element 10, the microwave filter 30 and the detector 50 can be formed on the same substrate.

The magnetic field detecting method using the magnetic sensor will be described in terms of an example in which the sensor is a 1 Tbpsi-compatible one, the magnetoresistance element 10 is a CPP-GMR element, and the microwave filter 30 is a bandstop filter.

Figure 2A:
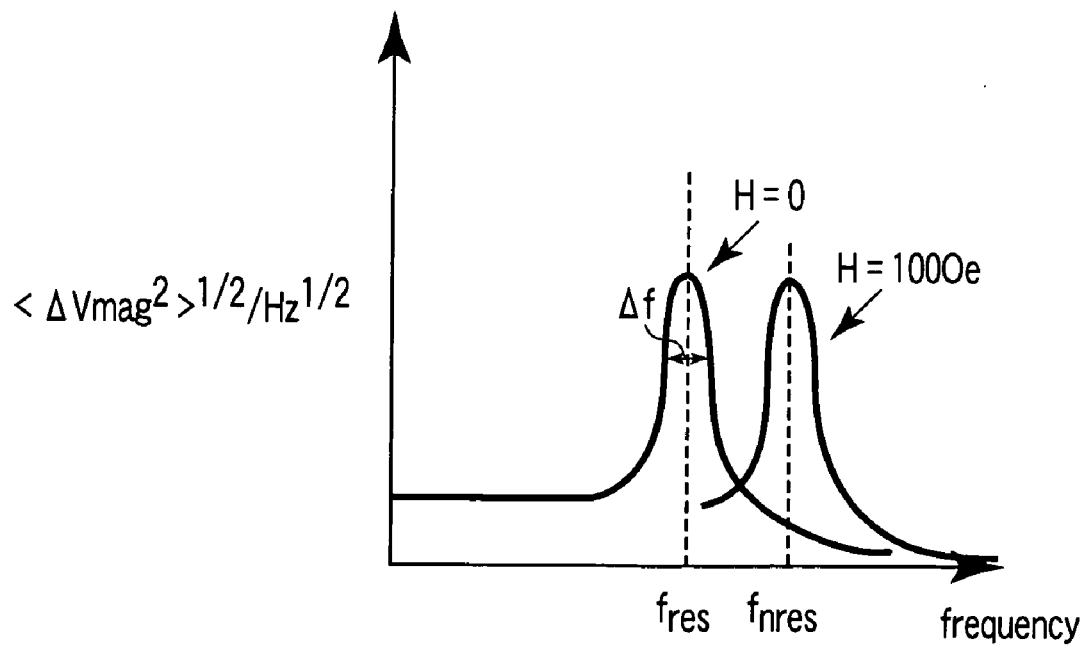
FIG. 2A shows the frequency spectrum of a microwave voltage caused by thermal fluctuation in magnetization of a minute ferromagnetic substance in the first embodiment.

Suppose that the size (area) of the CPP-GMR element in which each layer in the composite film is formed into the same pattern is 30×30 nm² and the thickness of the magnetization free layer is about 1 nm. When a current I is caused to flow in the CPP-GMR element, a noise voltage is produced across the element due to thermal fluctuation of magnetization of the magnetization free layer. The effective value $V_{mag}$ of this noise voltage can be expressed by $$V_{mag} = \left(\int <\Delta v_{mag}^2> df\right)^{\frac{1}{2}} = IR\left(\frac{\Delta R}{R}\right)\left(\int S_{<m_1>} df\right)^{\frac{1}{2}} \quad (1)$$

where R is the element resistance of the CPP-GMR element, $\Delta R/R$ is the MR ratio of the CPP-GMR element, and $\Delta V_{mag}$ is the spectrum of the noise voltage produced by thermal fluctuation of magnetization of the magnetization free layer. Here, using the imaginary part $\chi''$ of the magnetic susceptibility of the magnetization free layer, the power spectrum $S_{<mt>}$ of the thermal fluctuation of magnetization of the magnetization free layer is given by the following equation (2):

$$S_{<m_1>} = \frac{2kT}{\pi f_{res}} \frac{\chi''}{M_s^2 V} \quad (2)$$

where k is the Boltzmann constant, T is the temperature (Kelvin), $f_{res}$ is the magnetic resonant frequency of the magnetization free layer given by equation (3), and Ms and V are the saturation magnetization and the volume, respectively, of the magnetization free layer.

$$2\pi f_{res} = \gamma \sqrt{4\pi M_s(H+H_k)} \quad (3)$$

where H is the strength of the external magnetic field applied to the CPP-GMR element, Hk is the strength of the anisotropic magnetic field of the magnetization free layer, and $\gamma$ is the gyromagnetic ratio. When an Fe layer is used as the magnetization free layer of the magnetoresistance element, $f_{res}$ is of the order of 10 GHz. The frequency spectrum of the noise voltage $V_{mag}$ given by equation (1) is schematically shown in FIG. 2A. The frequency spectrum exhibits a peak at the resonant frequency $f_{res}$ and the width $\Delta f$ of the peak is expressed by $\Delta f = 2\alpha f_{res}$ using the gilbert attenuation coefficient $\alpha$. FIG. 2A shows spectra when the external magnetic field strength H is 0 and 100 Oe. Application of an external magnetic field causes the peak frequency to vary according to equation (3). The peak frequency varies by 0.2 to 0.3 GHz, for example. The noise voltage produced across the magnetoresistance element due to thermal fluctuation of magnetization of the magnetization free layer exhibits a peak under the magnetic field having the resonant frequency. In other words, the magnetoresistance element has a peak of a thermal fluctuation strength of magnetization under the magnetic field having a certain frequency.

Figure 2B:
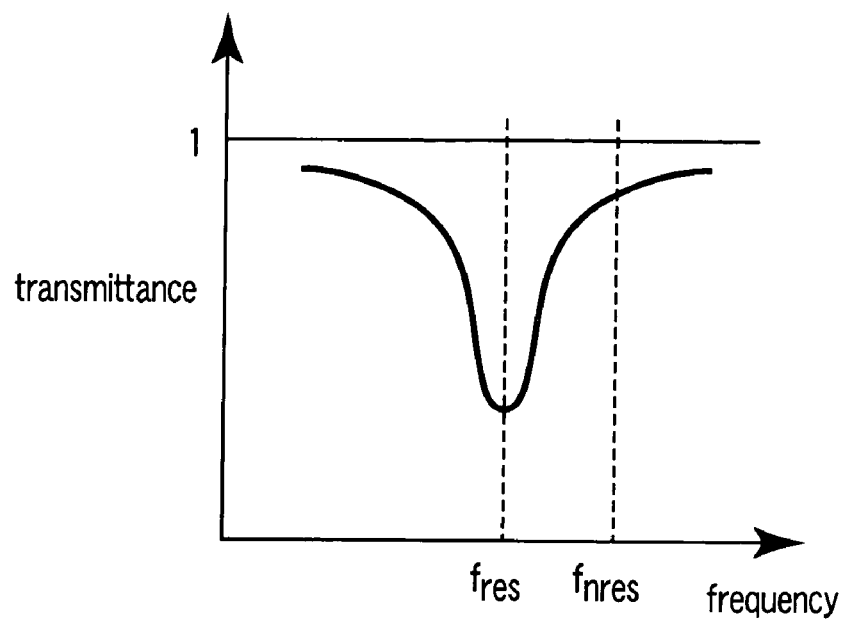
FIG. 2B shows transmittance versus frequency for a bandstop filter of the magnetic sensor of the first embodiment.

FIG. 2B shows the frequency characteristic of the transmittance of the bandstop filter 30. In the case of a magnetic resonance type of filter, its transmittance is minimum at the resonant frequency $f_{res1}$. In using a magnetic resonance type of filter, however, when necessary, provision such as housing the filter in a magnetic shield must be made for preventing the resonant frequency from being varied by an external magnetic field. If the same magnetic substance as the material for the magnetization free layer is used as the magnetic substance for the filter, adjustment of the bias magnetic field to the magnetization free layer will make it easy to match the filter and the magnetization free layer with each other in resonant frequency at H=0. As the bias magnetic field to the magnetization free layer, use can be made of leakage magnetic fields from hard magnetic films of, say, CoPt formed on both sides of the CPP-GMR element. As the magnetic shield for the bandstop filter 30, the magnetic shield for the MR element can be used.

Figure 2C:
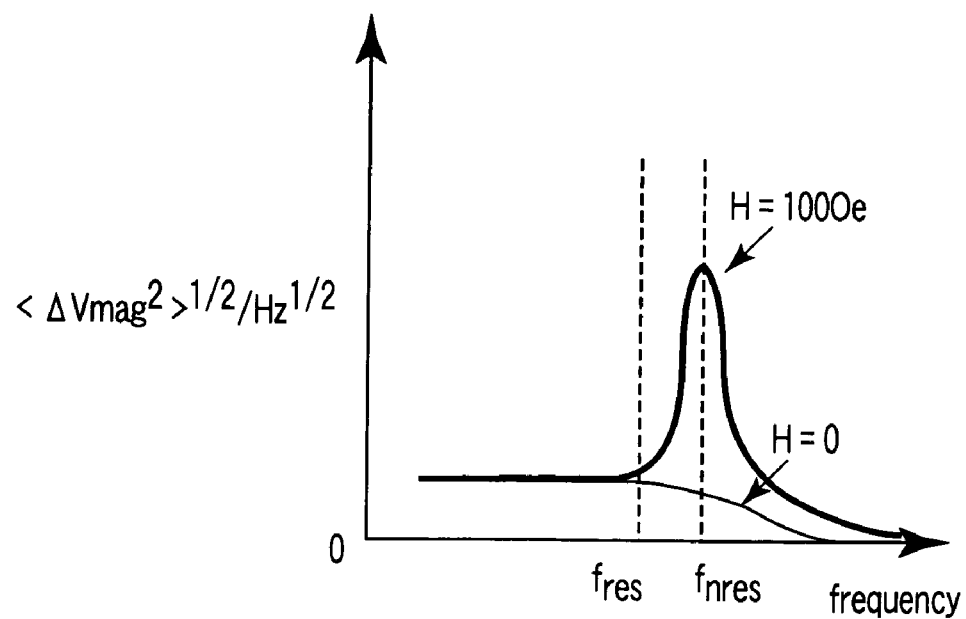
FIG. 2C shows the frequency spectrum of the output voltage of the bandstop filter in the first embodiment.

When the resonant frequencies of the bandstop filter 30 and the magnetization free layer substantially match ($f_{res}$ and $f_{res1}$ are substantially equal to each other), the microwave (f=fn$_{res}$) close to the peak of the noise spectrum (in the neighborhood of H=0) cannot pass through the bandstop filter 30 and consequently its output becomes very small. When the magnetization free layer is subjected to an external magnetic field H, the peak of the noise spectrum shifts as shown in FIG. 2A. As the result, as shown in FIG. 2C, microwave out of the resonant frequency ($f_{res}$) of the magnetization free layer becomes able to pass through the bandstop filter 30. By detecting and amplifying the transmitted microwave in the detector 50, a signal corresponding to a change in the external magnetic field H can be taken out.

Supposing a CPP-GMR element using an Fe layer as the magnetization free layer and having an MR ratio of 6.7%, the magnitude of the output voltage (the effective value of the noise voltage) can be calculated as saturation magnetization Ms=1700 G, noise coefficient $\alpha$=0,03, and resonant frequency $f_{res}$=10 GHz.

The output voltage depends on the direct current I allowed to flow through the element. In FIG. 3 are shown calculations with power consumption $W=RI^2$ as 50 μW to prevent destruction of the element. In FIG. 3, the resistance R of the CPP-GMR element is shown on the horizontal axis and the output voltage is shown on the vertical axis. The output voltage depends on the characteristic impedance Zo of the transmission line connected to the CPP-GMR element. In FIG. 3, a curve (a) shows a case for Zo=200 Ω and a curve (b) shows a case for Zo=50 Ω. In both curves (a) and (b), a high output voltage is obtained when the element resistance R matches the characteristic impedance. In addition to a noise due to thermal fluctuation in magnetization, an electrical noise Ve1 due to fluctuation in electron current, such as Johnson noise, shot noise, etc., is present in the CPP-GMR element. It is known that the electrical noise is generally expressed by the following equation (4):

$$<v_{el}^2> = 2eVR\coth\left(\frac{eV}{2kT}\right)\Delta f \quad (4)$$

This electrical noise is frequency-independent white noise. With ev<<2kT=50 MV, the electrical noise corresponds to Johnson noise. With EV>>2kT, on the other hand, the electrical noise corresponds to shot noise. $\Delta f$ in equation (4) is the band width of the electrical noise. By adjusting the frequency range to be used, the band width can be taken to be the same as the peak width of the aforementioned fluctuation spectrum.

With the magnetic sensor of this embodiment, a change in magnetic noise due to an external magnetic field is utilized as a signal. The magnetic field-independent electrical noise indicated by equation (4) forms the main cause of deterioration in the S/N ratio. The S/N ratio calculated using the signal strength $V_{mag}$ shown in FIG. 3 and the noise indicated by equation (4) are shown in FIG. 4. The resistance R of the CPP-GMR element is shown on the horizontal axis in FIG. 11. The S/N ratio does not much depend on the characteristic impedance of the transmission line and is of the order of 20 (26 dB).

The magnetic substance in which thermal fluctuation in magnetization occurs has dimensions of, say, 50 nm×5 nm×1 nm. For the magnetic conductive layers 11 and 13 of the CPP-GMR element, use may be made of Co, Ni, FeNi, or FeCo in addition to Fe. In particular, FeNi is preferable because it exhibits small magnetization and large fluctuation. To form one of the magnetic conductive layers 11 and 13 into a magnetization pinned layer, it is required to use a magnetic material having such a high coercive force that magnetization will not rotate even under expected external magnetic fields. For the magnetization free layer, use is made of a material having such a low coercive force that magnetization is allowed to rotate under expected external magnetic fields. It is also possible to use a material low in coercive force for the magnetization pinned layer and pin its magnetization through exchange coupling with an antiferromagnetic material adjacent to it.

For the nonmagnetic conductive layer 15, use can be made of a noble metal, such as Cu, Au, Ag, Pt, etc., or a nonmagnetic transition metal, such as Ru, Rd, Pd, Cr, etc. In addition to the magnetic conductive layers 11 and 13 and the nonmagnetic conductive layer 15, the composite film may be added with a buffer layer, a capping layer, and other additional, auxiliary layers.

When a bandpass filter is used as the high-frequency filter, a narrowband amplifier can be used to provide the same advantages.

In the arrangement of FIG. 1, incorporation of the filter 30 into the sensor would allow an inexpensive general-purpose amplifier to be used as the succeeding amplifier.

Second Embodiment

Figure 5:
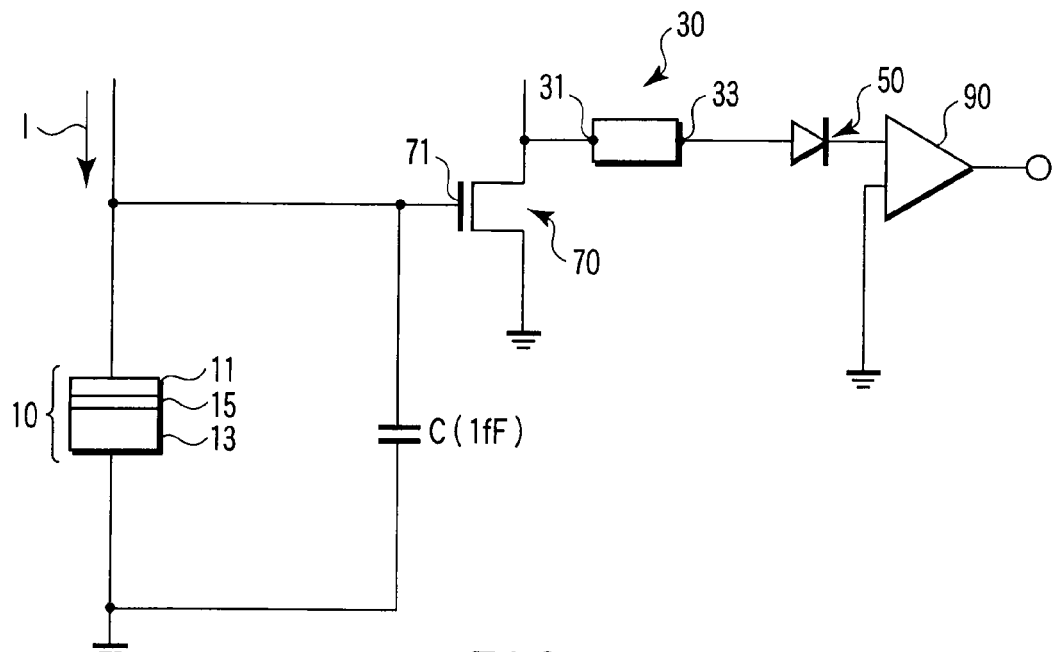
FIG. 5 shows a circuit diagram of a magnetic sensor using an FET according to a second embodiment of the present invention.

In the second embodiment, a magnetic sensor is combined with a field effect transistor (FET) to improve further the characteristics. FIG. 5 shows an example of a combination of the magnetic sensor of the first embodiment and an FET.

In FIG. 5, the CPP-GMR element 10 is directly connected to the gate 71 of an FET 70 of high input resistance rather than being connected through a low-impedance transmission line. Thus, the use of a TMR element higher in resistance and MR ratio than the CPP-GMR element as the magnetoresistance element 10 is favorable because it provides a higher output. However, care must be taken in using the TMR element because too high a resistance of the TMR element would make a large time constant with the gate capacitance of the FET which is of the order of 1 fF, resulting in attenuation of a microwave generated in the element.

Figure 6:
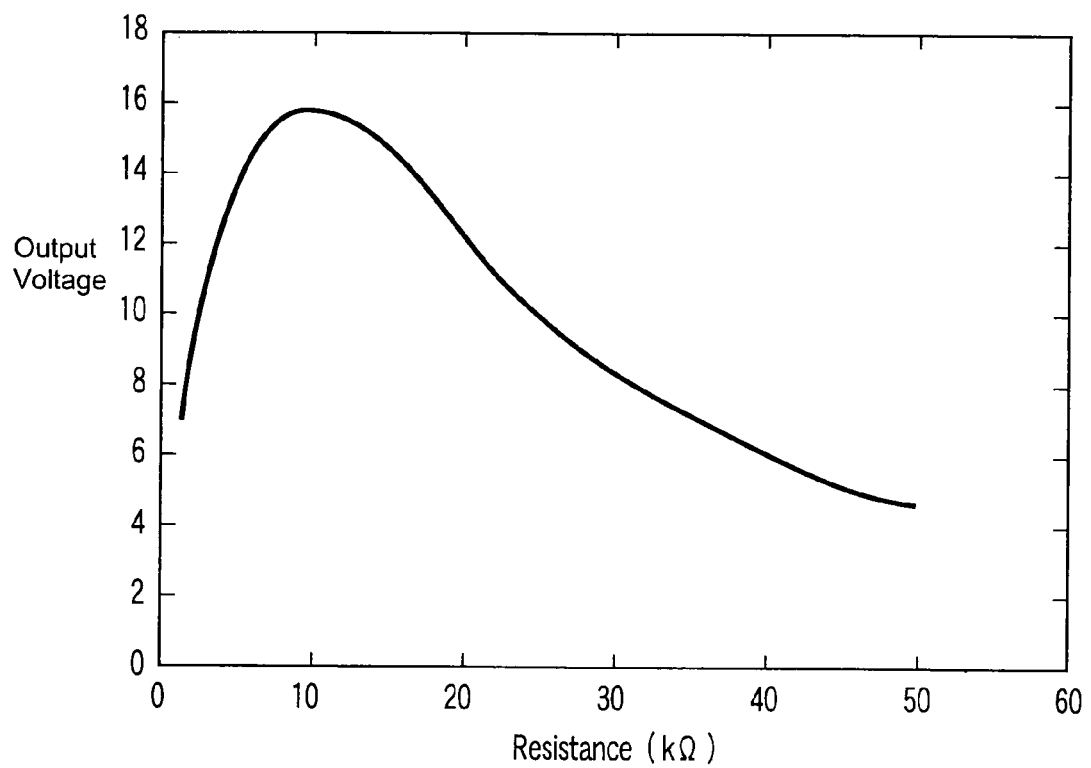
FIG. 6 shows output voltage versus element resistance for the magnetic sensor according to the second embodiment.
Figure 7:
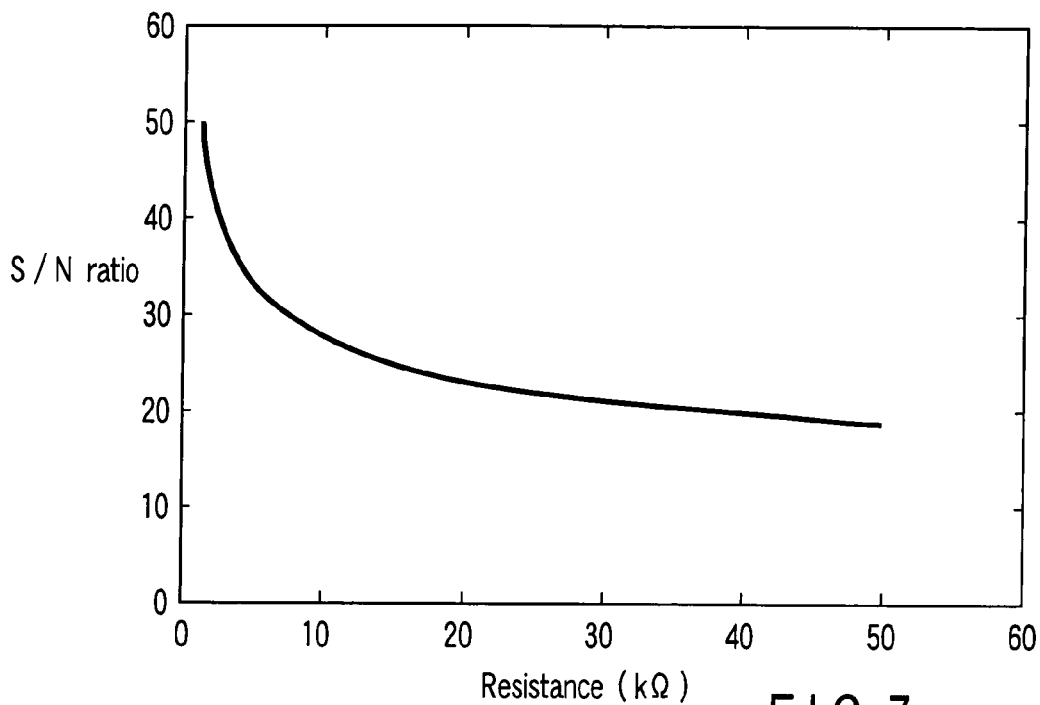
FIG. 7 shows S/N ratio versus element resistance for the magnetic sensor according to the second embodiment.

FIG. 6 shows the output voltage ($V_{mag}$) versus the resistance R of the magnetoresistance element 10 and FIG. 7 shows the S/N ratio versus the resistance R of the magnetoresistance element 10 when an Fe layer is used as the magnetization free layer of the TMR element, the MR ratio is set to 20% and the power consumption is set to 10 µW. From comparison of FIG. 6 with FIG. 3 it can be seen that the use of a TMR element large in MR ratio provides higher output voltages than with a CPP-GMR element. In addition, the S/N ratio does not lower. This is because, although the electrical noise increases due to high resistance of the TMR element, the signal voltage also increases. As shown in FIG. 7, the S/N ratio is about 28 (29 dB) when the junction resistance is 10 kΩ. It is due to the gate capacitance of the FET 7 that the output decreases on the high resistance side in FIG. 6. By reducing the gate capacitance, the output voltage can be further increased.

In this embodiment, since the magnetoresistance element 10 and the filter 30 are coupled not through a low-impedance transmission line but through the gate 71 of the FET 7 high in input resistance; therefore, the use of a TMR element high in resistance and MR ratio as the magnetoresistance element allows high output voltages to be obtained.

Third Embodiment

Figure 8A:
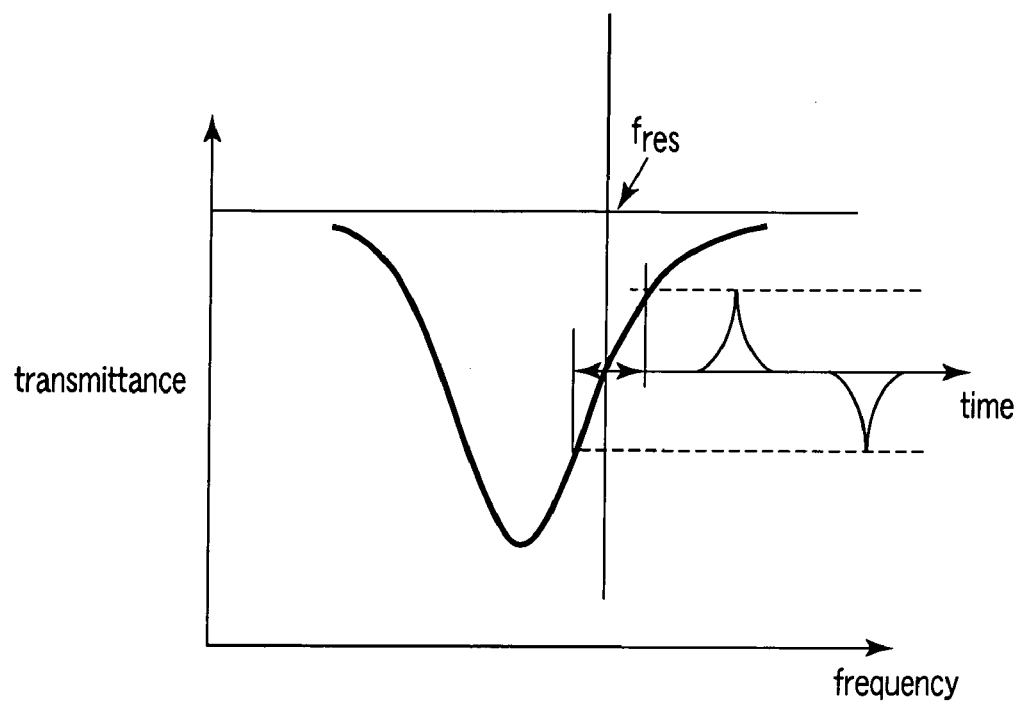
FIG. 8A shows transmittance versus frequency for a read head having a bandstop filter according to a third embodiment of the present invention.

To use the magnetic sensor of each embodiment of the present invention as a magnetic head, the resonant frequency of the element and the filter frequency are displaced relative to each other by adjusting the bias magnetic field as schematically shown in FIG. 8A, thereby allowing signals on a recording medium to be reproduced.

Figure 8B:
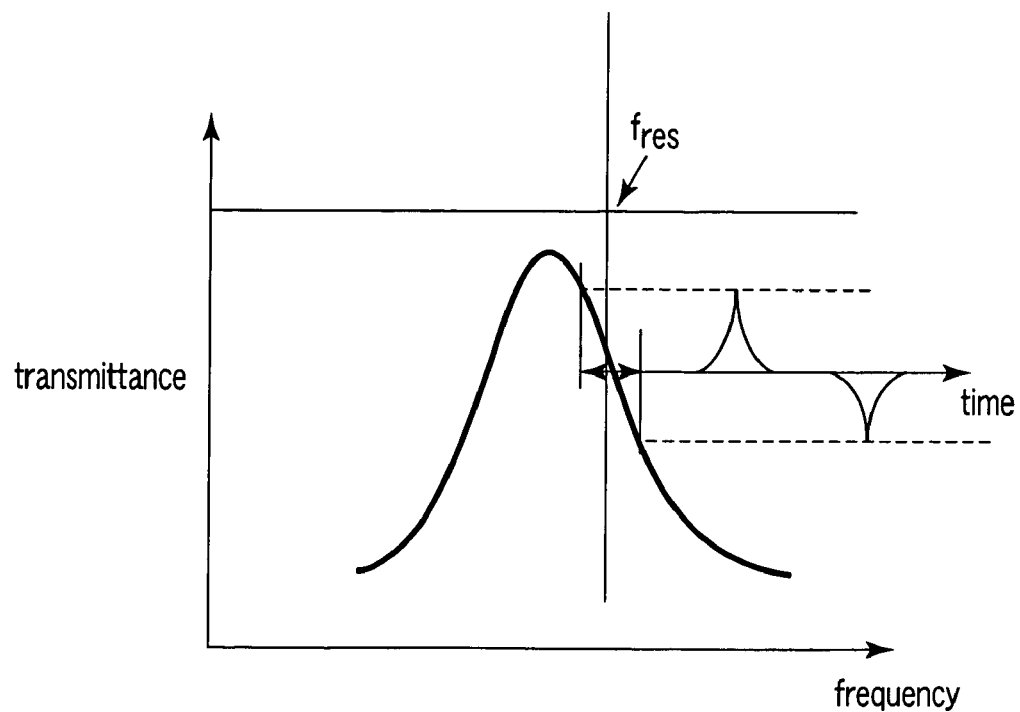
FIG. 8B shows transmittance versus frequency for a read head having a bandpass filter according to the third embodiment.

FIG. 8A shows the case where a bandstop filter is used as the microwave filter. As shown in FIG. 8B, it is also possible to use a bandpass filter or a high-frequency (low-frequency) cutoff filter. This embodiment is not limited to the above example. For example, it is also possible to use a narrowband amplifier as the microwave filter or incorporate the microwave filter into the detector. According to this embodiment, a high-sensitivity, high-S/N-ratio magnetic head can be provided.

EXAMPLE 1

The Fabrication of a CPP-GMR Element Used in the First Embodiment and the Measurement of Magnetic Noise.

Figure 9:
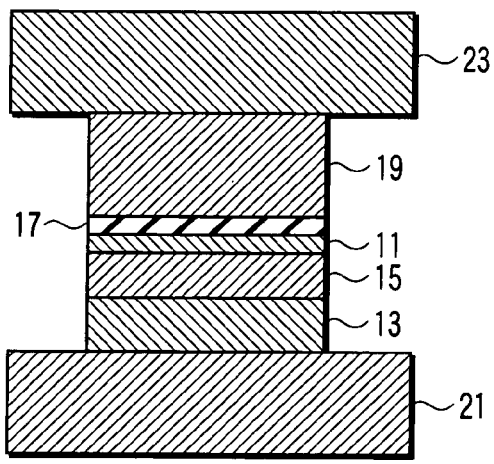
FIG. 9 is a sectional view of a magnetoresistance element according to a first example.

As schematically shown in FIG. 9, a magnetoresistance element 10 is fabricated on a sapphire substrate using sputtering deposition and electron beam lithography. The magnetoresistance element 10 comprises a stacked structure of a Au layer 21, a Fe layer 13, a Au layer 15, a Fe layer 11, a AlOx layer 17, A Aub layer 19, and a Au layer 23.

The Au layer 21 is 100 nm thick, the Fe layer 13 is 50 nm thick, the Au layer 15 is 30 nm thick, the Fe layer 11 is 1 nm thick, the AlOx layer 17 is 0.5 nm thick, the Au layer 19 is 100 nm thick, and the Au layer 23 is 100 nm thick. These thicknesses are the expected thicknesses at deposition process time and may differ from those in the fabricated element within some tolerance. The AlOx layer 17 has a number of minute through holes. With the normal fabrication method, short-circuiting occurs in the AlOx layer 17 as small as 0.5 nm in thickness with the result that the minute through holes (not holes formed in a controlled manner) are formed. To bring the resistance close to 50 Ω, such minute holes are employed. The area of contact between the layers in the stacked Fe/Au/Fe/AlOx/Au layers is set to 100×100 nm².

The two Fe layers 11 and 13 are formed under a magnetic field of about 1000 Oe and given uniaxial magnetic anisotropy in a know manner. The AlOx layer 17 is in ohmic contact with the adjacent Fe and Au layers 11, 13, 15 and hence the element does not form a tunnel junction but is a confined CPP-GMR element in which current is confined by the AlOx layer 17.

The element resistance R of the element is 52 Ω and the MR ratio (=ΔR/R) is about 4.8% (measured under conditions of room temperature, a current of 0.2 mA, and a magnetic field of 15000 Oe). The noise spectrum of the element is observed through the use of a measurement system shown in FIG. 11. A waveguide 110 uses a coplanar guide having a characteristic impedance of 50 Ω. The waveguide 110 is connected through a probe 120 to a bias T 130 and an amplifier 140 to a spectrum analyzer 150. The bias T 130 is used to apply a voltage without affecting a high-frequency signal.

Figure 12:
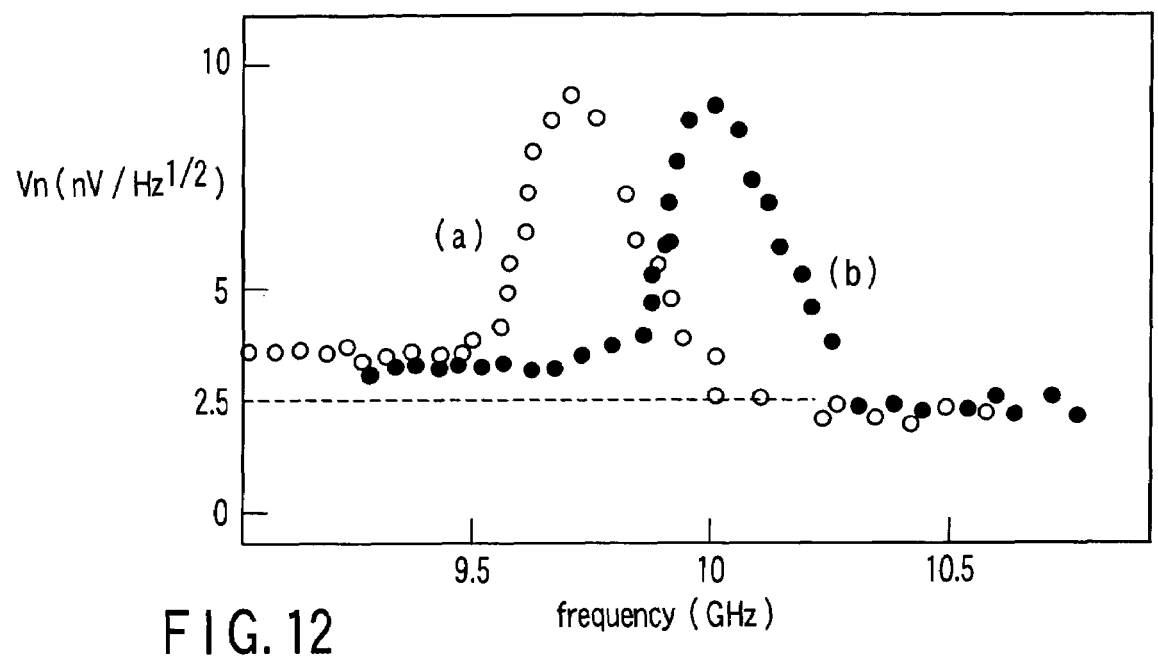
FIG. 12 shows the spectra of microwave voltages observed in the first example.

The measurement of the noise spectrum is made with an external magnetic field (H) applied in the direction of in-plane easy magnetization in the Fe layers 11, 13 and a current of 1.4 mA caused to flow in the CPP-GMR element through the bias T. The results are shown in FIG. 12. White dots (a) indicate a spectrum when an external magnetic field H of 4000 Oe is applied. Black dots (b) indicate a spectrum when an external magnetic field H of 1000 Oe is applied. It can be seen that the peak of the spectrum shifts by about 0.3 GHz when the external magnetic field H varies by 60 Oe.

The gilbert attenuation coefficient α estimated from the spectrum peak width (half-value width) is about 0.03. It can be seen that a magnetic noise of about 7.2 nV/$\sqrt{MHz}$ is superimposed on an electrical noise of about 2.5 nV/$\sqrt{Hz}$.

EXAMPLE 2

The Fabrication of a TMR Element and the Measurement of Magnetic Noise.

Figure 10:
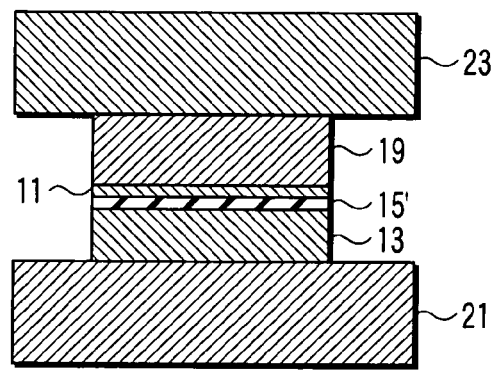
FIG. 10 is a sectional view of a magnetoresistance element according to a second example.

As schematically shown in FIG. 10, a tunnel junction element is fabricated in the same manner as in the example 1. The tunnel junction element has stacked layers of Au layer (100 nm thick) 21, Fe layer (50 nm thick) 13, AlOx (1 nm thick) layer 15, Fe (1 nm thick) layer 11, Cu (100 nm thick) layer 19, and Au layer (100 nm thick) 23. The AlOx layer 15 in this example is a continuous film without microholes and forms a tunnel junction together with the adjacent Fe layers 11, 13.

The resistance R of the element is 2.1 kΩ and the MR ratio (=ΔR/R) is 22% (measured under the same conditions as in the example 1). The measurement of the noise spectrum is made with a current of 0.2 mA flowing in the element in the same manner as in FIG. 10. It can be seen that a magnetic noise of about 9.3 nV/$\sqrt{Hz}$ at maximum is superimposed on an electrical noise of about 0.4 nV/$\sqrt{Hz}$.

EXAMPLE 3

The Fabrication of a Bandstop Filter Using a Magnetic Substance

Figure 13A:
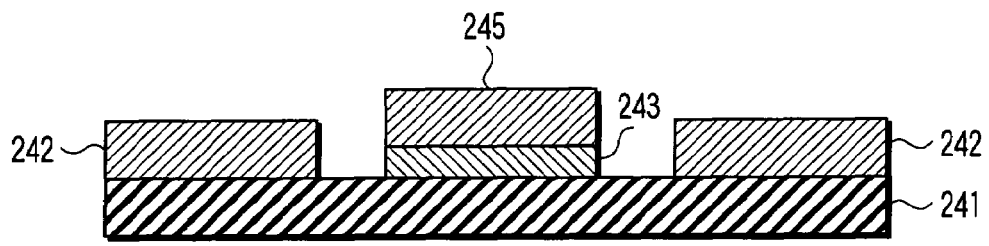
FIG. 13A is a sectional view of a bandstop filter used in a third example.

A bandstop filter using a magnetic substance having a magnetic resonant frequency will be described with reference to FIG. 13A, which is a schematic sectional view of a coplanar guide type of bandstop filter. The filter is fabricated on a sapphire substrate 241 through the use of sputtering deposition and photolithography.

As in the example 1, the sputtering deposition of a Fe layer 243 is performed with a magnetic field of about 1 kOe applied parallel to the surface of the sapphire substrate 241. Cu layers 242 of 3 μm in thickness are used as the ground planes. A stacked film (2.0 μm in width and 3 μm in thickness) of Fe film (400 nm thick) 243 and Au film (2.6 μm thick) 245 is used as the stripline.

The spacing between the stripline and the ground plane is set to 10 μm so that the characteristic impedance becomes 50 Ω. The overall length of the stripline in the direction perpendicular to the paper sheet of FIG. 13A is set to 3 mm.

The filter characteristics are evaluated using a network analyzer with a constant external magnetic field applied in the direction of length of the stripline. The connection of the filter and the network analyzer to a measuring cable is made using a microwave probe.

Figure 17:
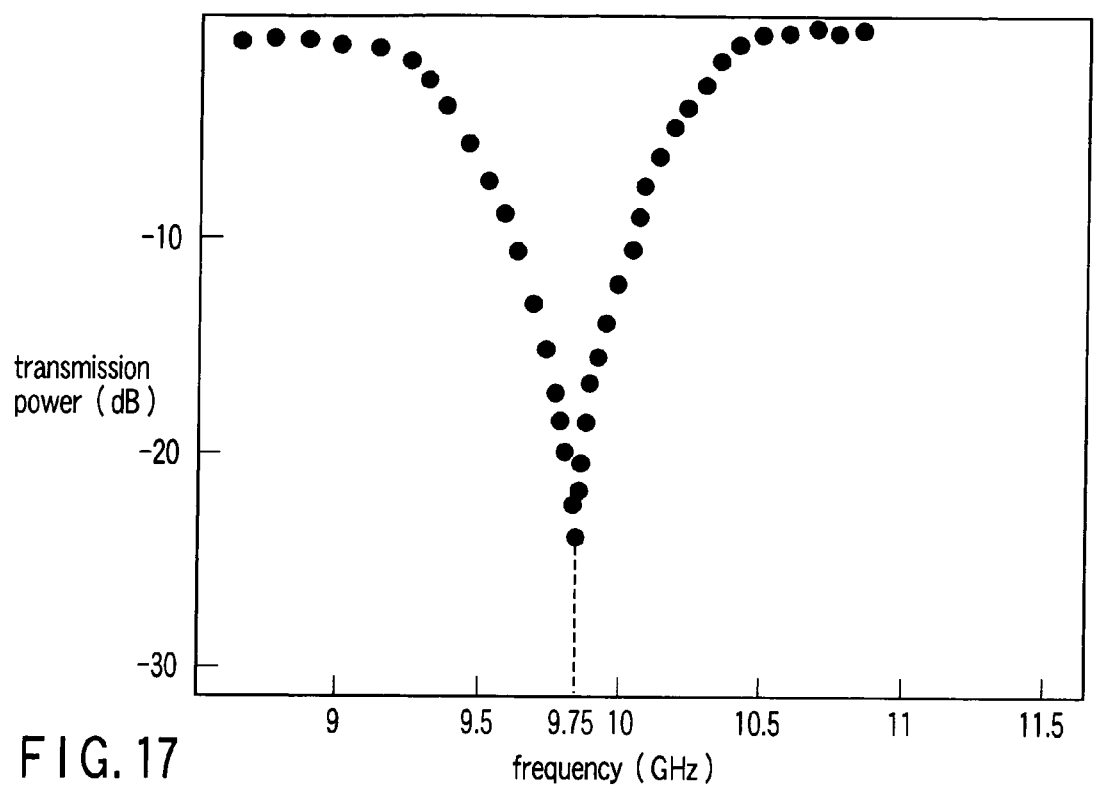
FIG. 17 shows transmittance versus frequency for the bandstop filter used in the third example.

The measurement under an external magnetic field of 1000 Oe is shown in FIG. 17. A reduction in transmitted power due to resonance absorption is observed in the vicinity of 9.75 GHz. The maximum amount of attenuation is 25 dB, the half-value width is 0.3 GHz, and the insertion loss is 2 dB.

EXAMPLE 4

The Fabrication and Evaluation of a Magnetic Sensor

Figure 13B:
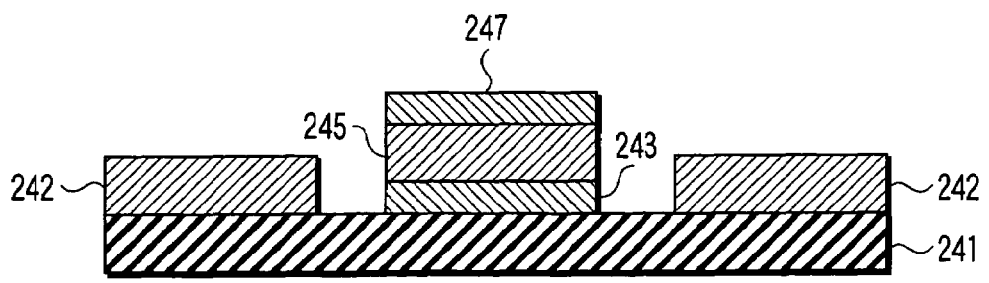
FIG. 13B is a sectional view of a bandstop filter used in a fourth example.

An element similar to the CPP-GMR element of the example 1 and the bandstop filter of FIG. 13B are fabricated on the same sapphire substrate 241 and both are connected by a coplanar guide.

As shown in FIG. 13B, the stripline of the bandstop filter is composed of lower and upper Fe layers 243 and 247 and an Au layer 245 sandwiched between the Fe layers 243 and 247. A microwave flowing due to the skin effect acts on only the lower Fe layer 243 on the sapphire substrate 241. The upper Fe layer 247 is formed in order to apply an effective magnetic field to the lower Fe layer 243. An effective magnetic field of about 100 Oe can be applied to the lower Fe layer 243 owing to magnetostatic interaction.

Figure 18:
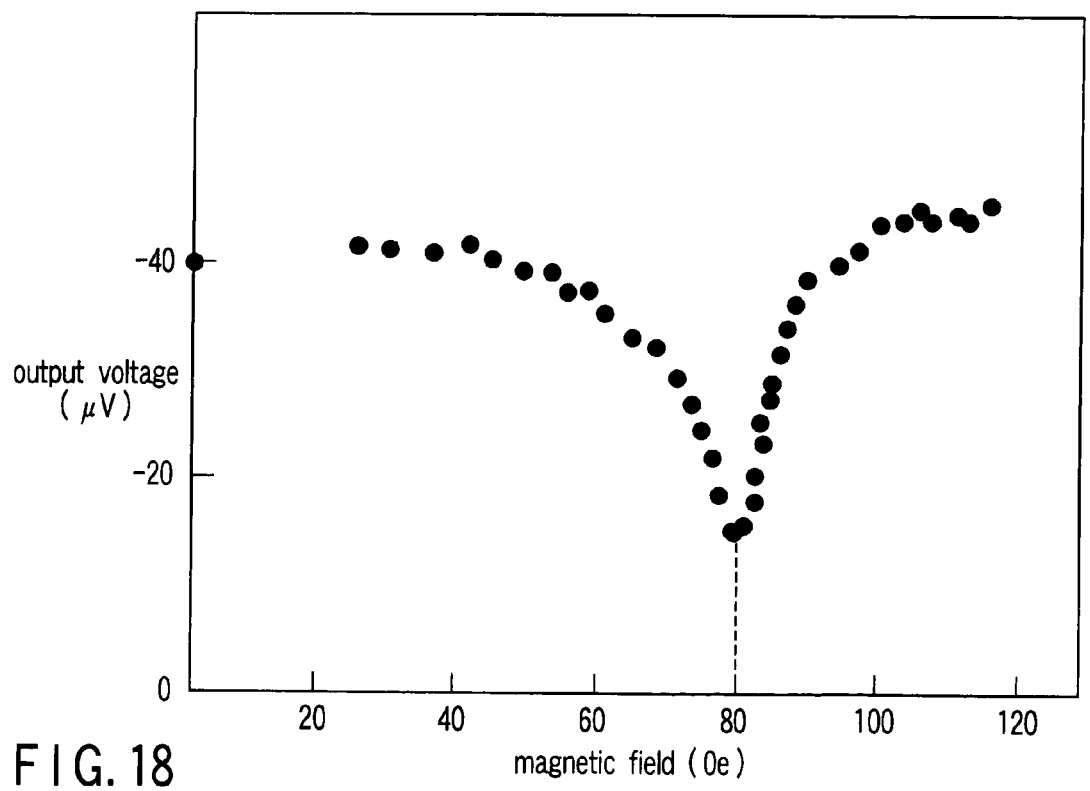
FIG. 18 shows output voltage versus magnetic field in the fourth example.

The bandstop filter is housed in a pair of magnetic shields formed of a thin film of permalloy. A current of 1.4 mA is caused to flow in the CPP-GMR element, and a signal is amplified by a narrowband amplifier having a central frequency of 10 GHz and a bandwidth of 1.5 GHz. The amplified signal is detected by a Schottky diode. Variations in output signal with magnetic field strength are shown in FIG. 18. When the magnetic field strength H varies from 0 to 800 Oe, the output decreases from 40 μV to less than 20 μV.

Figure 14:
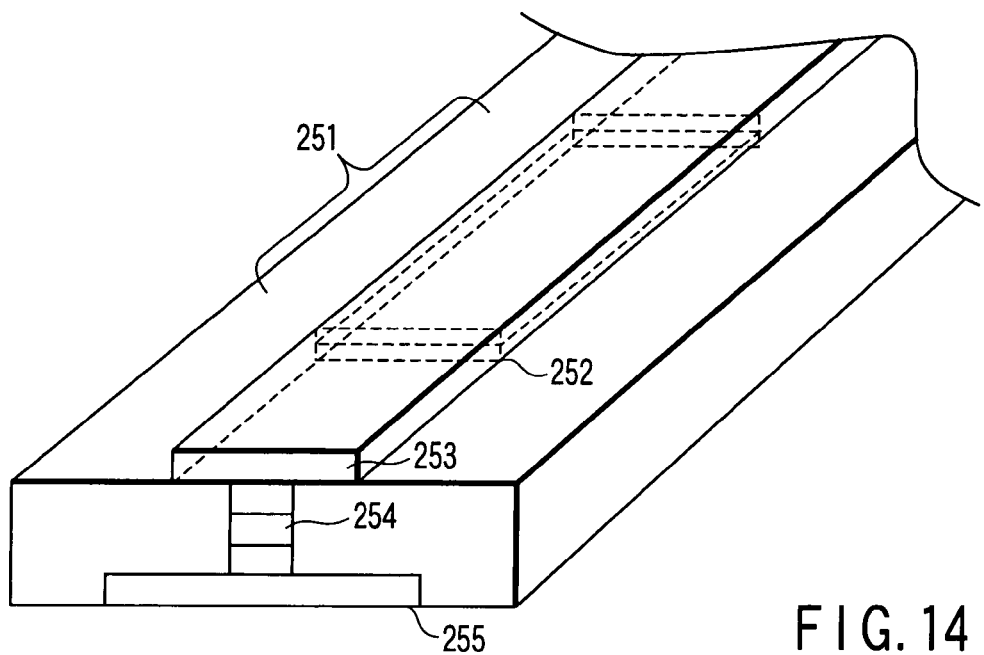
FIG. 14 is a perspective view of the bandstip filter of FIG. 13A.
Figure 15:
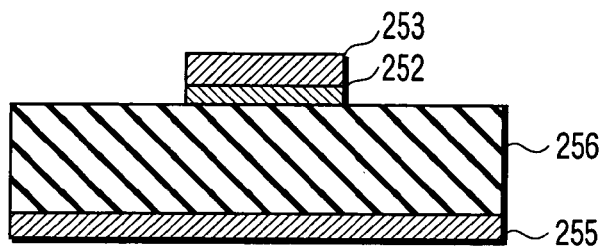
FIG. 15 is a sectional view of the macro strip line shown in FIG. 14.

FIGS. 14 and 15 show a micro stripline type filter unit. A micro stripeline magnetic transmission line filter 251 is fabricated on a substrate and includes a film 252 formed of magnetic material such as Ni, Fe, Co, etc. The filter 251 is connected to an upper electrode wiring (signal line) 253 formed of Cu, etc. A magnetoresistance element 254 is disposed between the upper electrode wiring 253 and lower electrode wiring (ground) 255.

Figure 16:
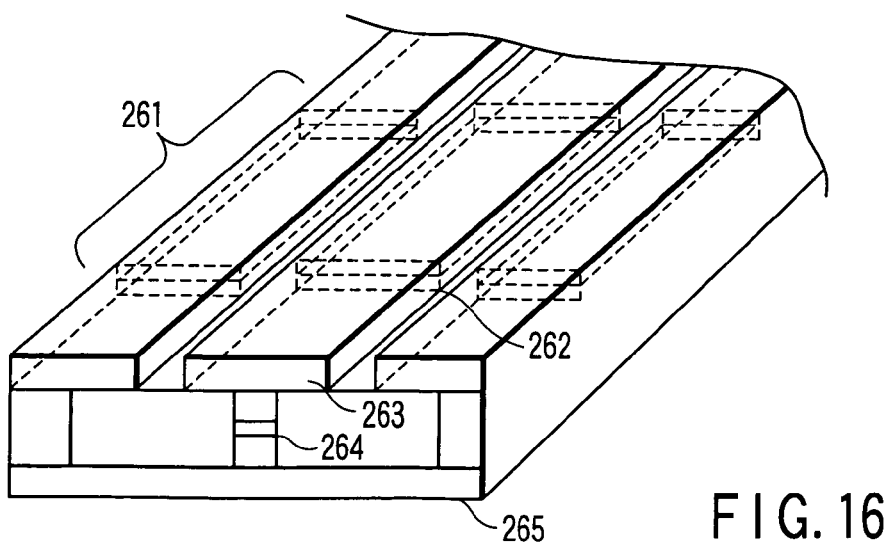
FIG. 16 is a perspective view of a coplanar guide type filter.

FIG. 16 shows a coplanar guide type filter unit including a coplanar magnetic transmission line filter 261 containing a magnetic film 262. The filter 261 is connected to an upper wring (signal line) 263. A magnetoresistance element 264 is disposed between the upper wiring 263 and lower wiring (ground) 265.

Fourth Embodiment

A magnetic recording head according to a fourth embodiment of the present invention will be described with reference to FIGS. 19A, 19B, and 20 through 24B in terms of a vertical magnetic recording head by way of example.

FIGS. 19A and 19B are schematic perspective views illustrating the relationship between recording tracks and a magnetic head. In FIG. 19A, only a certain recording track 301 on a magnetic recording medium is shown for convenience of illustration. The magnetic recording medium, if it is in the form of a disk, rotates around its axis. The medium and the head are moved with respect to each other. In FIG. 19A, the magnetic head moves in the direction of an arrow.

Perpendicularly magnetized bits 301$a$, 301$b$, etc. are recorded on the recording track 301 by the magnetic recording head. The magnetic recording head has a recording magnetic pole 305 and a coil (not shown) that excites the magnetic pole. The recording magnetic pole 305 is provided on its leading side with a spin wave oscillator 303, which is adapted to locally heat the recording track 301 prior to recording by the recording magnetic pole 305.

The recording magnetic pole 305 is provided on its trailing side with a read head, which is composed of a sensing element 307, such as a magnetoresistance element, a pair of shields 309a and 309b between which the sensing element 307 is sandwiched, and a lead wire (not shown) which supplies a sense current to the sensing element 307.

The spin wave oscillator 303 is divided into a spin torque type and a spin resonance type according to the structure of its oscillation layer. Either oscillator (spin torque type or spin resonance type) has two ferromagnetic layers: a magnetization free layer in which magnetization rotates in accordance with an external magnetic field and a magnetization pinned layer in which magnetization is virtually pinned.

The methods of pinning magnetization of the magnetization pinned layer include a method which involves stacking a magnetic layer and an antiferromagnetic layer and utilizing exchange coupling between the layers and a method which uses a material of high coercive force for a magnetic layer. For the magnetization free layer, on the other hand, use is made of a material having such coercivity that an applied magnetic field allows magnetization to rotate.

In the spin torque type oscillator, a spin wave is generated in the magnetization free layer by injecting a spin-polarized current from the magnetization pinned layer into the magnetization free layer. In the spin resonance type oscillator, a spin wave is generated in the magnetization pinned layer by injecting a spin fluctuation current from the magnetization free layer into the magnetization pinned layer. Thus, the spin torque type and the spin resonance type are different in the principles of exciting the spin wave. Hereinafter, the structure and operation common to both will be described.

Reference is now made to FIGS. 20 and 21 to describe the spin wave oscillator 303.

The spin wave oscillator 303 has a composite film composed of a first magnetic layer 331, a second magnetic layer 333, and a nonmagnetic layer 335 sandwiched between these magnetic layers. A pair of electrodes 338 and 339 are provided to allow current to flow perpendicularly to the surface of the composite film. When a current flows perpendicularly to the plane of each layer in the composite film, a strong spin wave is generated in the second magnetic layer 333.

The spin wave oscillator 303 is provided with a hard bias film 337 formed in contact with the first magnetic layer 331 or with a metal, such as Ta, interposed between it and the first magnetic layer 331. The hard bias film 337 applies a bias magnetic field to the second magnetic layer 333, which oscillates a spin wave to control and bring the oscillation frequency close to the magnetic resonant frequency. Thus, the efficiency of heating the medium can be increased.

Although, in FIGS. 20 and 21, a layer of metal, such as Ta, is formed between the electrode 338 and the second magnetic layer 333 for the purposes of securing flatness and protecting the electrode, it is not indispensable for the spin wave oscillator.

Arrows shown in the hard bias layer 337, the first magnetic layer 331 and the second magnetic layer 333 in FIGS. 20 and 21 indicate the directions of magnetization of the individual layers. In FIG. 20, each layer is magnetized parallel to its plane (in the in-plane direction), while, in FIG. 21, each layer is magnetized perpendicular to its plane.

To heat the medium by a high-frequency vibrating magnetic field generated from the spin wave oscillator 303, it is effective that the vibrating magnetic field has a component perpendicular to the direction of magnetization of the medium. That is, the direction of the fluctuation of magnetization of the magnetic layer in which the spin wave is excited is a direction of a magnetic field due to magnetic dipole vibrating in z axis direction. The magnetic field must have a component perpendicular to the direction of magnetization of the medium.

The high frequency magnetic field which the element produces is one produced due to the magnetic dipole vibrating in z axis direction in a surface parallel with a YZ plane. Therefore, in the element of oscillation layer having in-plane magnetization, XY plane, YZ plane or XZ plane can face the recording medium. FIG. 20 shows a structure wherein the XZ plane faces the recording medium and the z axis direction is a moving direction of a head. The YZ plane on which an electrode is formed is disadvantage for adjusting a distance with respect to the recording medium, so that the XZ plane or XY plane preferably faces the recording medium.

The track width and the bit width are determined from the recorded bit size in the medium (see a plan view of FIG. 22A and a perspective view of a recorded bit in FIG. 22B). Making the oscillation layer 333 of the spin wave oscillator comparable in size to the recorded bit allows efficient heating recording.

On the other hand, when the second magnetization layer 333 is vertically magnetized as shown in FIG. 21, the magnetic field is generated due to the magnetic dipole vibrating in a plane parallel with the XY plane and YZ plane. The bit width and track width indicate optimum element sizes when the XY plane faces the recording medium. In FIG. 21, the moving direction of the recording head is an x axis direction.

The spin wave oscillator 303 subjects a minute recording portion (corresponding to a bit recording portion) of the underlying recording track 301 to a microwave magnetic field, the magnitude of which is of the order of h=$10^3$-$10^4$ Oe. Suppose here that the distance between the spin wave oscillator 303 and the magnetic recording medium surface is about 10 nm, and the volume and the magnetization of the oscillation layer (the second magnetic layer 333) are about 30×30× 10 $nm^3$ and about $10^3$ gausses, respectively.

The power P of the microwave that the magnetic recording medium absorbs depends on the imaginary part, $\chi''$, of the susceptibility of the medium and is expressed by the following equation (5):

$$P = \frac{1}{2}\chi'' h^2 \omega \qquad (5)$$

$\chi''(\omega)$ depends strongly on frequency and is small, less than unity at frequencies away from the magnetic resonant frequency of the medium. However, it increases to the order of 10 to 100 at the magnetic resonant frequency of the medium or at frequencies close to it. Since the efficiency of heating the medium depends on the absorbed power P, it is important to heat the medium at frequencies close to its magnetic resonant frequency. When the spin wave frequency of the oscillator is close to the magnetic resonant frequency of the medium, the power absorbed into the medium is estimated from equation (5) to be $10^{18}$-$10^{21}$ erg/s·$cm^3$ per unit volume. $\omega$ is taken to be $2\pi \times (10^{10}$-$10^{11})$/s on the assumption that the magnetic resonant frequency is in the range of 10 to 100 GHz.

As an example, consider the case where FePt having a heat capacity of about $3\times10^7$ erg/K$cm^3$ is used for the magnetic recording layer. When locally heated by the spin wave oscillator 303, a minute portion of the medium has its anisotropic energy Ku1 decreased. For recording under an external magnetic field of several thousand oersteds (kOe), the temperature of the minute portion is increased from room temperature by about 100K. With the writing speed set to 1 GHz, a temperature increasing rate of about 100K/ns is required.

It takes a time of about 1 ns for the recording magnetic pole 305 to come over the minute portion heated by the spin wave oscillator. In order to prevent the heated portion from being cooled during that time, the heat radiation rate of the heated portion based on heat conduction and radiation needs to be less than 100K/ns. Using the above heat capacity, this heat radiation rate corresponds to an energy release rate of $3 \times 10^{18}$ erg/s·cm$^3$.

FIG. 23 is a diagrammatic representation of a relationship between a power of $10^{18}$ to $10^{21}$ erg/s·cm$^3$ supplied from the spin wave oscillator 303 to a minute portion of the medium and an energy release rate of less than $3 \times 10^{18}$ erg/s·cm$^3$. If the oscillation frequency is adjusted to increase $\chi''(\omega)$ and consequently the difference between the supplied power and the released energy becomes more than $3 \times 10^{18}$ erg/s·cm$^3$, the temperature increasing rate can be increased above 100K/ns. That is, the temperature of a minute portion of the medium can be increased by more than 100K within 1 ns.

The oscillation frequency f of the spin torque type oscillator 303 when the oscillation layer 333 is a ferromagnetic substance is expressed by the following equation (6):

$$f = \frac{\gamma}{2\pi} \sqrt{(H+H_k)(H+H_k+4\pi M_s)} \quad (6)$$

where γ is the gyromagnetic ratio, H is the strength of the bias magnetic field from the hard bias layer 337, Hk is the strength of the anisotropic magnetic field in the oscillation layer (the second magnetic field 333) and corresponds to 2 Ku1/Ms, Ku1 is the anisotropic energy of the oscillation layer, and Ms is the saturation magnetization of the oscillation layer. The strength H of the bias magnetic field is at most several hundreds of oersteds and 4πMs is of the order of $10^4$ oersteds. The strength Hk of the anisotropic magnetic field can be varied over a wide range of 10 to $5 \times 10^4$ Oe by choosing a suitable material. Accordingly, it can be seen from equation (6) that the oscillation frequency f of the spin wave oscillator 303 can be varied over a wide range of several hundreds of MHz to several tens of GHz by changing the strength Hk of the anisotropic magnetic field in the oscillation layer 333.

With FePt mentioned above, the magnetic resonant frequency is about 50 GHz. It is therefore desirable that the frequency of the spin wave oscillator 303 be also set to about 50 GHz. To this end, a magnetic thin film in which Hk is $10^4$ Oe and Ku1 is $10^7$ erg/cm$^3$ is used as the oscillation layer 333.

Not only a FePt film but any other magnetic film which is used as a high-density recording medium has a magnetic resonant frequency of more than 10 GHz. It is therefore desirable that Ku1 of the oscillation layer 333 be more than $5 \times 10^6$ erg/cm$^3$. Examples of such magnetic films include films of alloys containing 50 atom % of CoCr, such as CoCrTa, CoCrTaPt, CoCrTaNb, etc., Co-based composite films, such as Co/Pd, Co/Pt, CoCrTa/Pd, etc., CoCrPt-based alloy films, FePt-based alloy films, SmCo-based alloy films containing rare-earth elements, and TbFeCo alloy films.

In addition, a composite film of a ferromagnetic film and an antiferromagnetic film utilizing exchange bias can also be used as the oscillation layer 333 because it exhibits a large anisotropic magnetic field (in this case, not uniaxial but unidirectional). Here, available antiferromagnetic substances include FeMn, NiMn, FeNiMn, FeMnRh, RhMn, CoMn, CrMn, CrMnPt, CrMnPt, CrMnRh, CrMnCu, CrMnPd, CrMnIr, CrMnNi, CrMnCo, CrMnTi, PtMn, PdMn, PdPtMn, and IrMn.

In the spin resonance type oscillator, as the oscillation layer 333 use is made of a composite film of a ferromagnetic layer and a nonmagnetic layer, such as Co/Ru, Co/Pd, Fe/Cr, etc. In this case, the oscillation frequency is given by the following equation (7):

$$f = \frac{\gamma}{2\pi} \sqrt{2H_E H_A} \quad (7)$$

are $H_E$ is the exchange magnetic field between ferromagnetic layers, and $H_A$ is the anisotropic magnetic field. In this case, $H_A$ is at most 10000 oe. HE depends on the thickness of the nonmagnetic layer and sharply increases with decreasing thickness. In order to set the oscillation frequency given by equation (7) to higher than 10 GHz, therefore, it is desirable to set the thickness of the nonmagnetic layer in the composite film to about 1 nm or less.

Materials of the ferromagnetic layer in the composite film include Fe, Co, Ni, and alloys containing at least one of Fe, Co, and Ni. Materials of the nonmagnetic layer include Pt, Au, Ag, Cu, Cr, Ru, Pd, Rh, Re, Os, Mo, W, and alloys containing at least one of these elements.

The thickness of the ferromagnetic layer in the composite film should be within the range of 0.1 to 2 nm, and preferably 1 nm or less. The thickness of the nonmagnetic layer should be within the range of 0.5 to 2 nm, and preferably 1 nm or less.

Figure 24A:
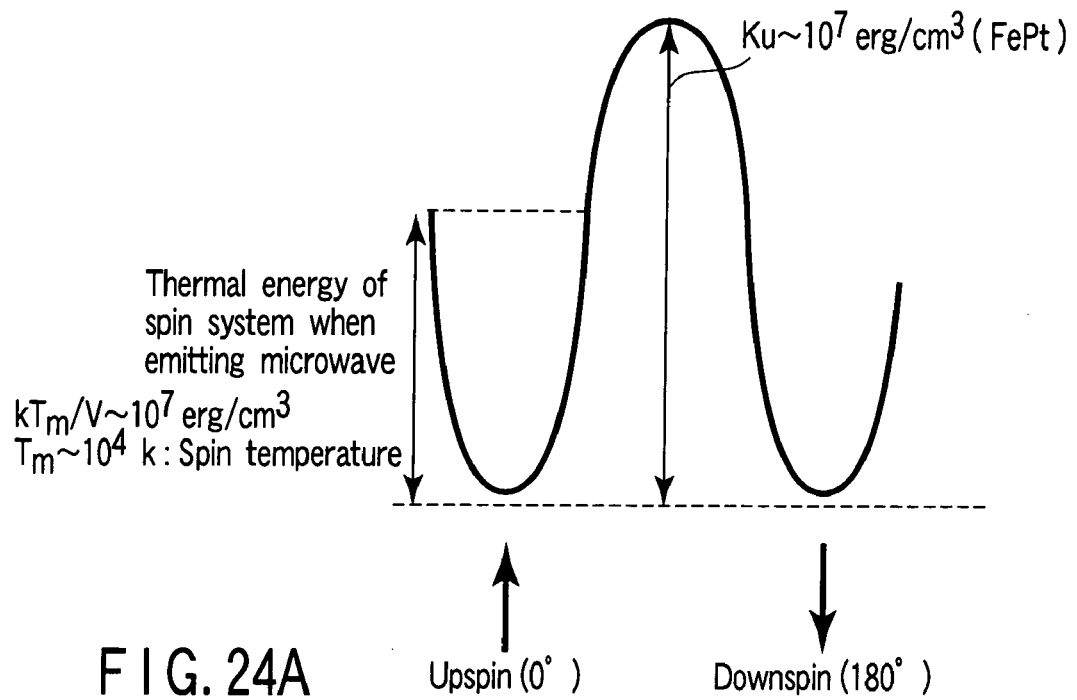
FIGS. 24A and 24B are diagrams for use in explanation of a write process by the magnetic head of the fourth embodiment.
Figure 24B:
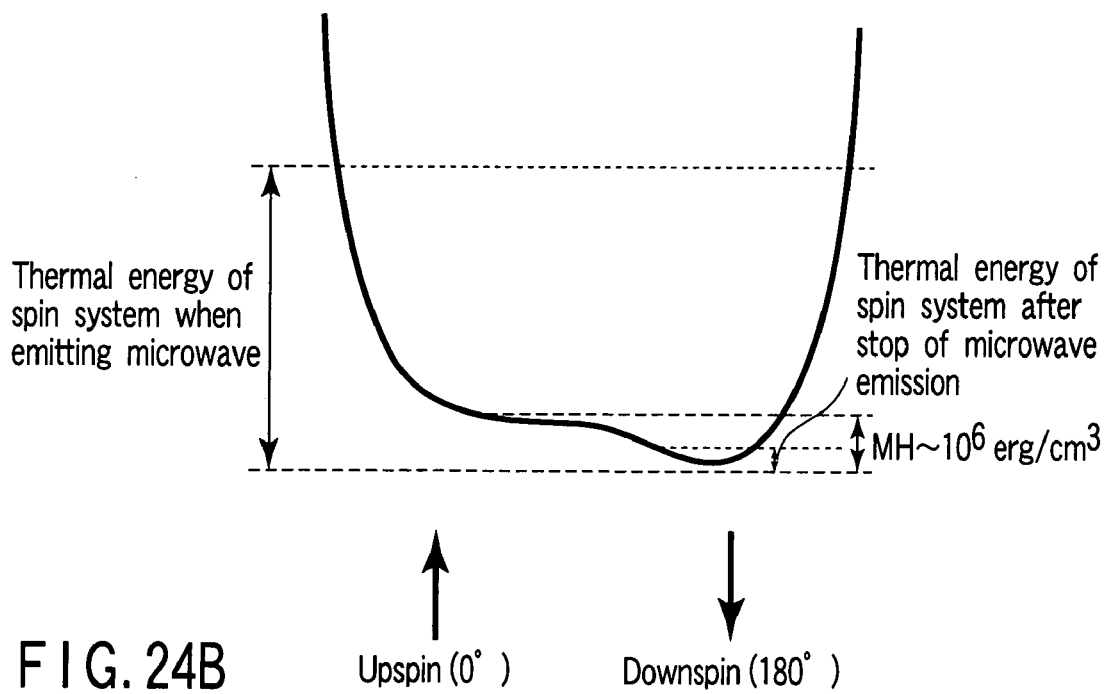

The writing by the recording head of the first embodiment will be described using energy diagrams shown in FIGS. 24A and 24B. FIG. 24A is an energy diagram during magnetic field irradiation, and FIG. 24B is an energy diagram after magnetic field irradiation. In each diagram, the angles of magnetization (upward magnetization (0°), downward magnetization (180°)) are shown on the horizontal axis and the energy is shown on the vertical axis. To reverse the direction of magnetization, energy greater than the anisotropic energy Ku shown in FIG. 24A is required.

First, by absorbing microwave magnetic energy generated by the spin wave oscillator 303, the magnetic temperature Tm (the temperature of spin system) of a magnetic recording portion is elevated to about $10^4$K within a time of about 10 to 100 ps. At this stage, since the lattice temperature of the minute portion of the recording track does not rise, Ku1 will not decrease. Since the energy absorbed into the spin system of the recording track relaxes into the lattice system in about 1 ns, the temperature of the minute portion increases by about 100K. At this stage, the anisotropic energy Ku1 of the recording track decreases (see FIG. 24A).

When the minute portion moves away from the spin wave oscillator 303 and arrives immediately under the recording magnetic pole 305 because of disk rotation, the microwave magnetic field of the recording track comes not to act on the spin wave oscillator 303 and the magnetic temperature returns to room temperature in about 1 ns. However, the lattice temperature is kept high and hence Ku1 remains small. At this stage, a recording magnetic field is applied to the minute portion. Subsequently, the writing is finished in a state where the lattice has cooled (see FIG. 24B).

Thus, according to the thermally assisted recording head of the fourth embodiment, a recording medium can be heated by magnetic near field by using a tiny spin wave oscillator as a high-frequency oscillator. In this case, the heating efficiency can be markedly increased by setting the oscillation frequency of the spin wave oscillator to match or approximate the magnetic resonant frequency of a magnetic recording portion.

Fifth Embodiment

A similar microwave heating method can be applied to rewriting of magnetic information in MRAMs. For example, the reversal of magnetization can be performed under a smaller current than conventionally required by combining heating of a magnetic tunnel junction of a memory cell through the use of a spin wave oscillator formed in vicinity of the tunnel junction and a current magnetic field from a wiring placed in the vicinity of the tunnel junction.

An exemplary structure of the memory cell will be described using a schematic sectional view shown in FIG. 25. In this diagram, a memory portion 350 contains a tunnel junction. The memory portion 350 is composed of at least two magnetic layers 351 and 353 and a tunnel layer 352 made of a nonmagnetic dielectric substance sandwiched between the magnetic layers 351 and 353. One of the two magnetic layers 351 and 353 is used as a magnetization pinned layer in which magnetization is pinned so as not to virtually rotate even when subjected to an external magnetic field, such as a current magnetic field. The other is used as a magnetization free layer in which, when it is subjected to an external magnetic field, magnetization is allowed to rotate. Here, the magnetic layer 351 is used as the magnetization free layer. Magnetization is recorded on the magnetization free layer by means of a rotating magnetic field contained in the plane of paper sheet of FIG. 25 and produced by causing current to flow through wirings 355 and 338 which double as electrodes. At this time, heating by the spin wave oscillator 303 makes the recording of magnetization easy, allowing the amount of current for recording to be decreased. With this structure, it is required that the high-frequency magnetic field generated by the spin wave oscillator 303 spread in a plane perpendicular to the direction in which layers are stacked.

According to the fifth embodiment, the microwave-based thermally assisted recording method using the spin wave oscillator can be applied to writing of magnetization in MRAMs and the amount of current for writing magnetic information into the tunnel junction can be made small.

EXAMPLE 1

Next, the fabrication of a spin torque type oscillator and its oscillation frequency will be described with reference to FIG. 26.

Figures 25, 26:
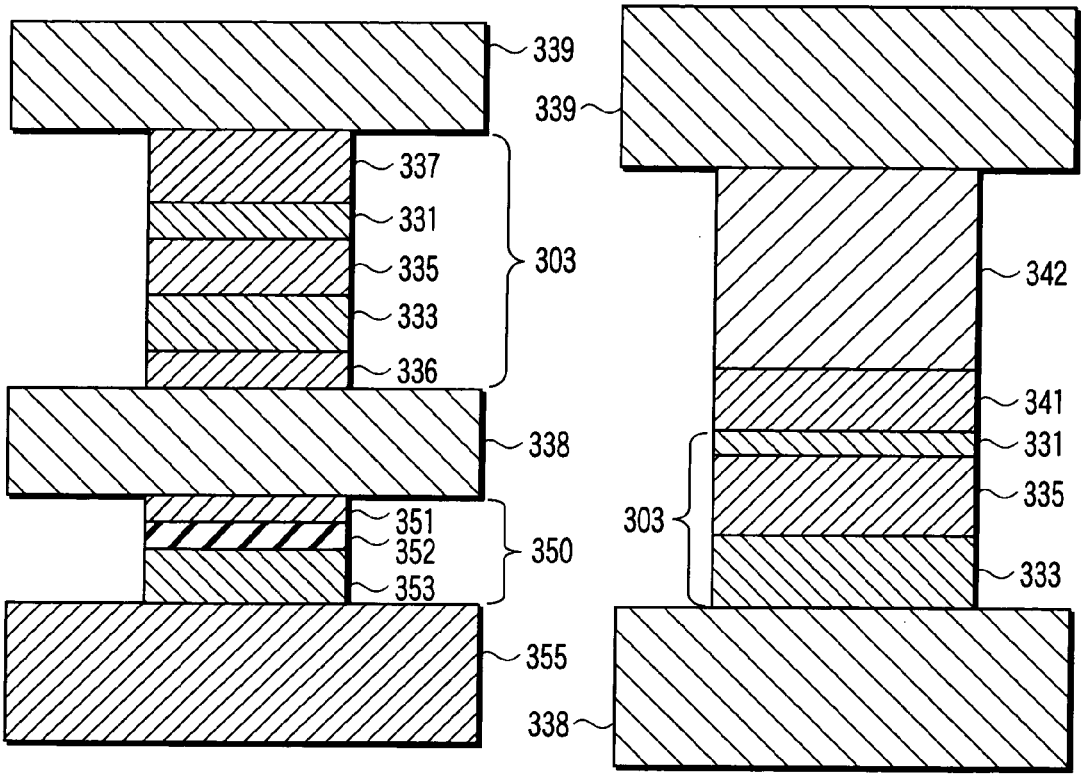
FIG. 25 is a sectional view of a magnetic memory device according to a fifth embodiment of the present invention.
FIG. 26 is a sectional view of a spin torque type of spin wave oscillator according to a first example regarding the fourth and fifth embodiments.

First, using deposition by sputtering in a magnetic field and electron beam lithography, such a stacked layer structure of Cu layer 338, FePt layer 333, Cu layer 335, FePt layer 331, Cu layer 341, Au layer 342, and Cu layer 339 as shown in FIG. 26 is fabricated on an Si substrate (not shown). The Cu layer 338 is about 100 nm thick, the FePt layer 333 is about 50 nm thick, the Cu layer 335 is about 30 nm thick, the FePt layer 331 is about 1 nm thick, the Cu layer 341 is about 10 nm thick, the Au layer 342 is about 100 nm thick, and the Cu layer 339 is about 100 nm thick. The contact area is set to about 100×100 nm². The FePt layers 331 and 333 are given vertical magnetic anisotropy such that the easy axis is aligned in the direction perpendicular to the plane of the layer surface. The saturation magnetization Ms of FePt layers 331 and 333 is 800 gausses and the anisotropic magnetic field Hk is 26 kOe. The element resistance R of the oscillator is 25 Ω and the MR ratio (=ΔR/R) is about 7%.

Figure 11:
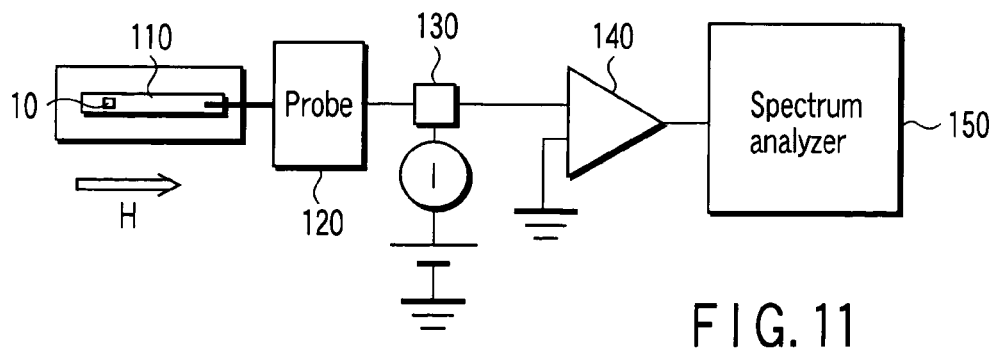
FIG. 11 shows a circuit diagram of a measuring system used in the first example.

In the case of using the measuring system shown in FIG. 11, the oscillator 10 is connected to an end of a coplanar guide 110 in which the width of the central conductor is 50 μm. The other end of the coplanar guide 110 is connected to through a microwave probe 120 to a coaxial cable having a characteristic impedance of 500Ω. The microwave output of the oscillator is transmitted through the probe 120 to the coaxial cable and then detected by a spectrum analyzer 150 through a bias T 130 and a preamplifier 140. When the density of a direct current flowing in the element exceeded 4×10⁶ A/cm², oscillations of a microwave at 58 GHz are confirmed by the spectrum analyzer 150. The oscillation strength monotonically increased with the current density and the element is destroyed at a current density of 2×10⁸ A/cm².

EXAMPLE 2

In the example 2, the fabrication of a spin torque type oscillator and the measurement of its oscillation frequency are performed.

In the example 2, an oscillator is fabricated in the same way as in the example 1 using n composite films each of Fe (0.5 nm)/Ir (0.5 nm) in place of the FePt layer 333. In fabricating the composite film of Fe/Ir, a magnetic field of 1000 oe is applied in the in-plane direction to align in-plane anisotropic axes. The number, n, of the composite films is 20. The saturation magnetization Ms is 850 gausses and the in-plane anisotropic magnetic field Hk is 15 kOe. The element resistance R of the oscillator is 35 Ω and the MR ratio (=ΔR/R) is about 9%. A bias magnetic field of 500 Oe is applied in the direction of in-plane easy magnetization and then oscillations of the element are observed through the spectrum analyzer in the same way as in the example 1. As the result, oscillations of 35 GHz are confirmed at a direct-current density of 2×10⁵ A/cm² or more.

EXAMPLE 3

In the example 3, an element is fabricated in the same way as in the example 2 except to use Fe1 (50 nm) and Fe2 (1 nm) in place of the composite films of Fe/Ir. The saturation magnetization Ms is 1700 gausses and the in-plane anisotropic magnetic field Hk is 500 Oe. The element resistance R of the element is 15 Ω and the MR ratio (=ΔR/R) is about 5%. A bias magnetic field of 500 Oe is applied in the direction of in-plane easy magnetization and then oscillations of the element are observed through the spectrum analyzer in the same way as in the example 1. As the result, oscillations of 17 GHz are confirmed at a direct-current density of 6×10⁵ A/cm² or more.

EXAMPLE 4

In the example 4, the fabrication of a resonance magnetoresistance type of spin wave oscillator and the measurement of its oscillation frequency are performed.

Figure 27:
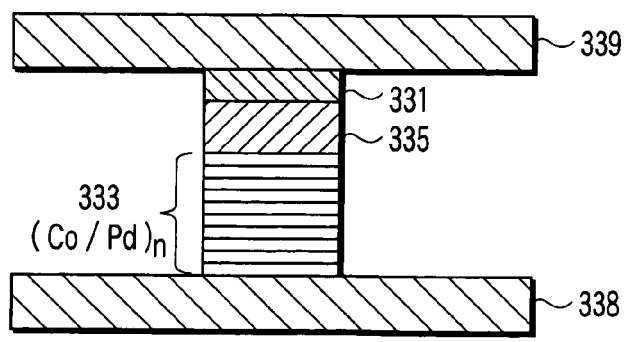
FIG. 27 is a sectional view of a spin resonance type of spin wave oscillator according to a second example regarding the fourth and fifth embodiments.

As schematically shown in FIG. 27, a spin wave oscillator is fabricated on a Si substrate by means of sputtering in a magnetic field. A Cu layer 335 is used as each of the lower and upper electrodes 338, 339, which double as heat sinks. A FePt layer (about 1 nm in thickness) 331 is used as a magnetic layer which causes thermal fluctuations in magnetization to occur. For a spin wave oscillation layer, use is made of an artificial antimagnetic substance (a Co layer about 1 nm in thickness/a Pd layer about 0.5 nm in thickness). The FePt layer 331 exhibits vertical magnetic anisotropy in which the axis of easy magnetization is in the direction perpendicular to the plane of layer surface as in the case of the embodiment 1. The saturation magnetization Ms of the FePt layer is 800 gausses and the anisotropic magnetic field Hk is 26 kOe. The Co layer of the Co/Pd composite film 333 is a vertically magnetized film and its magnetic resonant frequency is 52 GHz. The Co film, when its thickness is set to less than 1.5 nm, forms a vertically magnetized film even if it is not subjected to an external magnetic field.

The microwave oscillations of the spin wave oscillator are measured in the same way as with the example 1 while the external magnetic field applied perpendicular to the layer plane is varied with a current of $10^5$ A/cm$^2$ flowing in the oscillator. As the result, oscillations of 54 GHz are observed with the external magnetic field in the range of 660 to 700 Oe.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic sensor to sense a magnetic field, comprising:
   a magnetoresistance element having a peak of a thermal fluctuation strength of magnetization under a sensing magnetic field having a certain frequency;
   a frequency filter connected to the magnetoresistance element and having a transmittance decreased or increased in substantially the certain frequency of the sensing magnetic field to output a signal corresponding substantially to the peak of the thermal fluctuation strength of magnetization; and
   a detector connected to the frequency filter to detect the magnetic field based on the signal of the frequency filter.

2. The magnetic sensor according to claim 1, wherein the frequency filter comprises a bandstop filter configured by magnetic films.

3. The magnetic sensor according to claim 1, wherein the frequency filter comprises a bandpass filter configured by magnetic films.

4. The magnetic sensor according to claim 1, wherein the frequency filter comprises a magnetic resonance filter in which magnetic resonance occurs at the frequency of the sensing magnetic field and consequently its transmittance varies.

5. The magnetic sensor according to claim 4, wherein the frequency filter comprises a bandstop filter configured by magnetic films.

6. The magnetic sensor according to claim 4, wherein the frequency filter comprises a bandpass filter configured by magnetic films.

7. The magnetic sensor according to claim 1, further comprising a field effect transistor having a gate electrode between the magnetoresistance element and the frequency filter, and wherein the magnetoresistance element has a tunnel junction composed of a magnetic substance, a dielectric substance, and a magnetic substance, and one of the magnetic substances of the magnetoresistance film is connected to the gate electrode of the field effect transistor.

8. The magnetic sensor according to claim 7, wherein the frequency filter comprises a bandstop filter configured by magnetic films.

9. The magnetic sensor according to claim 7, wherein the frequency filter comprises a bandpass filter configured by magnetic films.

10. The magnetic sensor according to claim 1, wherein the magnetoresistance element, the frequency filter and the detector are formed on the same substrate.

* * * * *